United States Patent
Tsuchiya et al.

(10) Patent No.: US 6,890,385 B2
(45) Date of Patent: May 10, 2005

(54) MULTI-FACE FORMING MASK DEVICE FOR VACUUM DEPOSITION

(75) Inventors: Terunao Tsuchiya, Shinjuku-ku (JP); Takuya Sakata, Shinjuku-ku (JP)

(73) Assignee: Dai Nippon Printing Co., Ltd. (JP)

( * ) Notice: Subject to any disclaimer, the term of this patent is extended or adjusted under 35 U.S.C. 154(b) by 176 days.

(21) Appl. No.: 10/399,943

(22) PCT Filed: Aug. 23, 2002

(86) PCT No.: PCT/JP02/08535
§ 371 (c)(1),
(2), (4) Date: Apr. 23, 2003

(87) PCT Pub. No.: WO03/019988
PCT Pub. Date: Mar. 6, 2003

(65) Prior Publication Data
US 2004/0020435 A1 Feb. 5, 2004

(30) Foreign Application Priority Data
Aug. 24, 2001 (JP) ........................................ 2001-255233
May 16, 2002 (JP) ........................................ 2002-142179

(51) Int. Cl.⁷ ........................ C23C 16/00; C23C 16/04; C23C 14/04
(52) U.S. Cl. ...................... 118/505; 118/504; 118/720; 118/721; 156/345.3
(58) Field of Search ................................ 118/504, 505, 118/720, 721, 723 VE; 156/345.3

(56) References Cited
U.S. PATENT DOCUMENTS
4,915,057 A * 4/1990 Boudreau et al. ........... 118/505
6,475,287 B1 * 11/2002 Clark .......................... 118/721
2002/0062785 A1 * 5/2002 Kim et al. ................... 118/504
2003/0101932 A1 * 6/2003 Kang .......................... 118/504
2003/0150384 A1 * 8/2003 Baude et al. ................ 118/721
2003/0221614 A1 * 12/2003 Kang et al. .................. 118/504
2004/0003775 A1 * 1/2004 Kim ............................ 118/504
2004/0020435 A1 * 2/2004 Tsuchiya et al. ....... 118/723 VE

FOREIGN PATENT DOCUMENTS

| JP | 2001-018358 | 1/2001 |
|----|-------------|--------|
| JP | 2001-089840 | 4/2001 |
| JP | 2001-237073 | 8/2001 |
| JP | U 3082805 | 10/2001 |
| JP | 2002-069619 | 3/2002 |

* cited by examiner

Primary Examiner—Jeffrie R. Lund
(74) Attorney, Agent, or Firm—Parkhurst & Wendel, L.L.P.

(57) ABSTRACT

A second metal mask (13) having a screen part (13A) provided with a plurality of parallel, fine slits (13a) arranged at very small intervals is placed on a base plate (12) serving also as a first metal mask and provided with a plurality of windows (18) defining regions in which a material is to be deposited. One end of the second metal mask (13) is fastened to the base plate (12) by a mask clamp (20) and the other end of the same is fastened to a slider (23). Resilient force is applied to the slider (23) by compression coil springs (30). Thus, the screen part (13A) of the second metal mask (13) is tensioned and thereby the slits (13a) are stretched straight and are extended at predetermined pitches. A substrate (17) placed on the second mask (13) is subjected to a vacuum evaporation process to form fine patterns on the substrate (17) in a gang-patterning mode.

21 Claims, 17 Drawing Sheets

MULTI-FACE FORMING MASK DEVICE FOR VACUUM DEPOSITION

TECHNICAL FIELD

The present invention relates to a gang-patterning mask device for vacuum evaporation to be used in a vacuum evaporation process for forming a predetermined pattern on a surface of a substrate to fabricate an organic EL device.

BACKGROUND ART

Referring to FIG. 17, an organic EL device is formed by forming anodes 2 of ITO, a hole-carrying layer 3, an organic layer (light-emitting layer) 4, an electron-carrying layer 5 and cathodes 6 in that order on a surface of a transparent substrate 1, such as a glass plate. The organic layer 4 is of a high-molecular type or a low-molecular type. Some organic EL devices are of a passive driving system and others are of an active driving system. The low-molecular organic layers of organic EL devices of a passive driving type and those of an active driving type, and the cathodes 6 of the organic EL devices of a passive driving system are formed by vacuum evaporation. A metal mask 8 as shown in FIG. 18 is used in forming the low-molecular organic layer and the cathode electrodes in a desired pattern by vacuum evaporation. The metal mask 8 has a screen part 8A provided with fine slits arranged at small intervals and corresponding to regions in which a material is to be deposited. In some cases, a cathode separator method (JP8-315981A) is used for forming the cathodes in a desired pattern by vacuum evaporation.

All the foregoing prior arts have problems. When the metal mask is used, the metal mask 8 is simply placed on a surface to be subjected to vacuum evaporation of a substrate, and the metal mask 8 is held in place by the magnetic attraction of a magnet disposed on the back surface of the substrate. Since the screen part 8A of the mask 8 has a very low rigidity, the slits of the screen part 8A is liable to be distorted in holding the metal mask on the surface of the substrate. Particularly, when the slits are very fine, the slits cannot be maintained in a desired accuracy and, consequently, highly accurate patterning cannot be achieved. Since the prior art metal mask 8 has only the single screen part 8A, only one substrate can be processed by each vacuum evaporation process, which reduces productivity. The cathode separator method adjusts exposure in photolithography to form partition walls having inclined side walls and hence stable manufacture is difficult. (The electrodes cannot be separated if the taper of the partition walls having the shape of an inverted trapezoid is small, and the partition walls fall down if the taper of the partition walls is large.)

DISCLOSURE OF THE INVENTION

The present invention has been made in view of the foregoing problems, and it is therefore an object of the present invention to provide a gang-patterning mask device for vacuum evaporation, capable of being placed on a surface of a substrate for patterning by vacuum evaporation with the accuracy of slits of a screen part secured, and of enabling vacuum evaporation at a high productivity.

According to the present invention, a gang-patterning mask device for vacuum evaporation having a plurality of effective mask parts arranged on longitudinal and transverse rows comprises: a first mask provided with a plurality of windows; and a second mask placed on the first mask and having a screen part provided with a plurality of fine slits extending in a longitudinal direction; wherein the screen part of the second mask is formed in an entire region in a transverse direction covering at least all the windows, and the screen part and the windows define the effective mask parts.

In the gang-patterning mask device for vacuum evaporation according to the present invention, the second mask has a pair of support parts on the transversely opposite sides, respectively, of the screen part.

In the gang-patterning mask device for vacuum evaporation according to the present invention, the windows of the first mask is formed in a shape corresponding to that of the effective mask parts, and the screen part of the second mask extends in a longitudinal direction across the plurality of windows.

In the gang-patterning mask device for vacuum evaporation according to the present invention, the first mask functions as a base plate, and a stretching-and-holding means for longitudinally stretching and holding the second mask is provided on the first mask.

In the gang-patterning mask device for vacuum evaporation according to the present invention, the first mask is placed on a base plate provided with an opening, and the stretching-and-holding means for longitudinally stretching and holding the second mask is provided on the base plate.

In the gang-patterning mask device for vacuum evaporation according to the present invention, the stretching-and-holding means includes a slider capable of holding an end part of the second mask and of moving relative to the base plate, and a moving means for moving the slider away from the base plate.

In the gang-patterning mask device for vacuum evaporation according to the present invention, the moving means is an elastic means capable of exerting resilient force.

In the gang-patterning mask device for vacuum evaporation according to the present invention, the opening of the base plate extends over all the windows of the first mask.

In the gang-patterning mask device for vacuum evaporation according to the present invention, the base plate is provided with a plurality of openings extending in a transverse direction, and the openings have a longitudinal length corresponding to that of the windows of the first mask.

Since the plurality of windows serve as effective mask parts, respectively, a plurality of patterns can be formed in a gang-patterning mode on a substrate of a size large enough to cover all the windows by vacuum evaporation at an improved productivity. Since the second mask is stretched along the length of the slits, the slits can be kept straight at predetermined pitches even if the mask part is a very fine one formed by arranging very fine slits at very small pitches, so that desired highly fine patterns can be formed on the substrate.

Highly fine patterns can be formed in a gang-patterning mode at a high productivity by placing a substrate to be subjected to vacuum evaporation on the second mask of the gang-patterning mask device, setting the gang-patterning mask device holding the substrate in a vacuum evaporation system, and carrying out a vacuum evaporation process.

The stretching-and-holding means fastens an end part of the second mask to the slider by a clamp, and moves the slider by the moving means so as to stretch the second mask to hold the second mask in tension. Thus, the slits of the screen part can be straightened and maintained at the predetermined pitches by a simple operation.

Although the moving means may be such as using a screw to move the slider by a desired distance, it is preferable to use an elastic means that exerts resilient force on the slider to push the slider away from base plate. The elastic means is able to exert a fixed pulling force always on the second mask, which further improves the positional accuracy of the slits.

In the gang-patterning mask device for vacuum evaporation according to the present invention, the second mask is provided with a plurality of screen parts, and the plurality of screen parts are arranged longitudinally at predetermined intervals.

In the gang-patterning mask device for vacuum evaporation according to the present invention, the screen parts of the second mask have a longitudinal length corresponding to that of the effective mask parts.

In the gang-patterning mask device for vacuum evaporation according to the present invention, the windows of the first mask are formed in a shape corresponding to that of the effective mask parts.

In the gang-patterning mask device for vacuum evaporation according to the present invention, each of the windows of the first mask extends longitudinally across the plurality of effective mask parts.

In the gang-patterning mask device for vacuum evaporation according to the present invention, the first mask functions as a base plate, and a stretching-and-holding means for longitudinally stretching and holding the second mask is provided on the base plate.

In the gang-patterning mask device for vacuum evaporation according to the present invention, the first mask is placed on a base plate provided with an opening, and a stretching-and-holding means for longitudinally stretching and holding the second mask is provided on the base plate.

In the gang-patterning mask device for vacuum evaporation according to the present invention, the stretching-and-holding means includes a slider capable of holding an end part of the second mask and of moving relative to the base plate, and a moving means for moving the slider away from the base plate.

In the gang-patterning mask device for vacuum evaporation according to the present invention, the moving means is an elastic means capable of exerting resilient force.

In the gang-patterning mask device for vacuum evaporation according to the present invention, the opening of the base plate extends over all the windows of the first mask.

In the gang-patterning mask device for vacuum evaporation according to the present invention, the base plate is provided with a plurality of openings extending in a transverse direction, and each openings has a longitudinal length corresponding to that of the windows of the first mask.

In the gang-patterning mask device for vacuum evaporation according to the present invention, the base plate has first end parts at longitudinally opposite ends to which the second mask is fixed, a transverse slit is formed on the inner side of one of the first end part, and the first end part adjacent to the slit is distorted inward beforehand to hold the second mask in a longitudinally stretched state.

In the gang-patterning mask device for vacuum evaporation according to the present invention, longitudinal notches are formed at the opposite ends of the slit, respectively.

Since the mask device according to the present invention is provided with the plurality of effective mask parts, patterns can be formed by vacuum evaporation in a gang-patterning mode by placing the mask device on a substrate of a size capable of covering all the effective mask parts. Since the second mask is longitudinally stretched, i.e., since the second mask is stretched along the length of the slits, the slits can be kept straight at predetermined pitches even if the mask part is a very fine one formed by arranging very fine slits at very small pitches, so that desired highly fine patterns can be formed on the substrate.

The stretching-and-holding means fastens an end part of the second mask to the slider and moves the slider by the moving means so as to stretch the second mask to hold the second mask in tension. Thus, the slits of the screen part can be straightened and maintained at the predetermined pitches by a simple operation. An optional stationary fastening means and an optional movable fastening means may be used respectively for fastening the second mask to the base plate and for fastening the second mask to the slider. Those fastening means may be spot-welding means, clamping means capable of clamping the second mask or fastening means using pins to be inserted in holes formed in the second mask. A fastening means using laser spot-welding is preferable because this fastening means is able to achieve fastening simply and is capable of securing necessary fastening strength.

Although the moving means may be such as using a screw to move the slider by a desired distance, it is preferable to use an elastic means that exerts resilient force on the slider to push the slider away from base plate. The elastic means is able to exert a fixed pulling force always on the second mask, which further improves the positional accuracy of the slits.

Another stretching-and-holding means may have second end parts in longitudinally opposite ends of the base plate. The second mask can be held in a longitudinally stretched state by stretching and fastening the second mask to the opposite second end parts. Preferably, a transverse slit is formed on the inner side of one of the second end parts. Since a part of the end part adjacent to the slit is elastically distortable, the end part can be elastically distorted inward by applying a predetermined force to the end part with a vise or the like in attaching the second mask to the base plate. The tensile force acting on the second mask can be easily adjusted to a desired value by fastening the second mask to the end parts in a predetermined tension with the end part elastically distorted, and then removing the pressure applied to the end part by the vise. The first mask can be formed on the inner side of the slit and a second end part can be formed on the outer side of the slit. Since the first end part and the second end part can be separated by the slit, the distortion of the second end part does not affect the first end part. Therefore, the first mask is not distorted and hence fine patterns can be always formed on the substrate.

Preferably, longitudinal notches extending toward an end part of the base plate are formed at the opposite ends of the slit, respectively. Since the strength of parts between the notches and the end part of the base plate is lower than that of a part between the slit and the end part of the base plate, i.e., a second end part, parts around the notches are distorted concentratedly and the second end part is displaced maintaining its straightness in distorting the second end part inward and fixing the second mask to the second mask fixing region. Consequently, the second mask as fixed to the second mask fixing region is not distorted.

BEST MODE FOR CARRYING OUT THE INVENTION

First Embodiment

Figure 1:
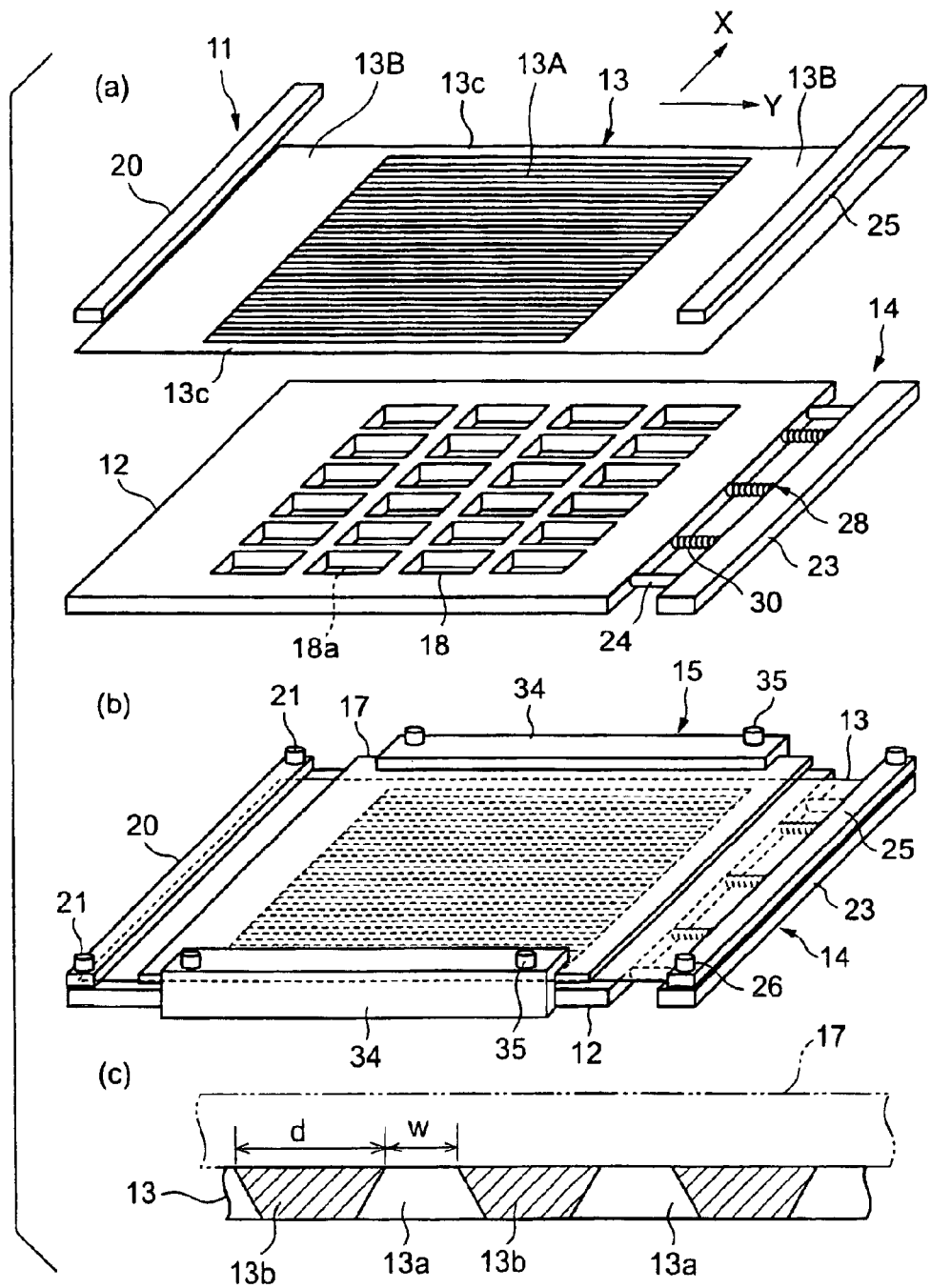
FIG. 1 is a view of principal component parts of a gang-patterning mask device in a first embodiment according to the present invention.
Figure 2:
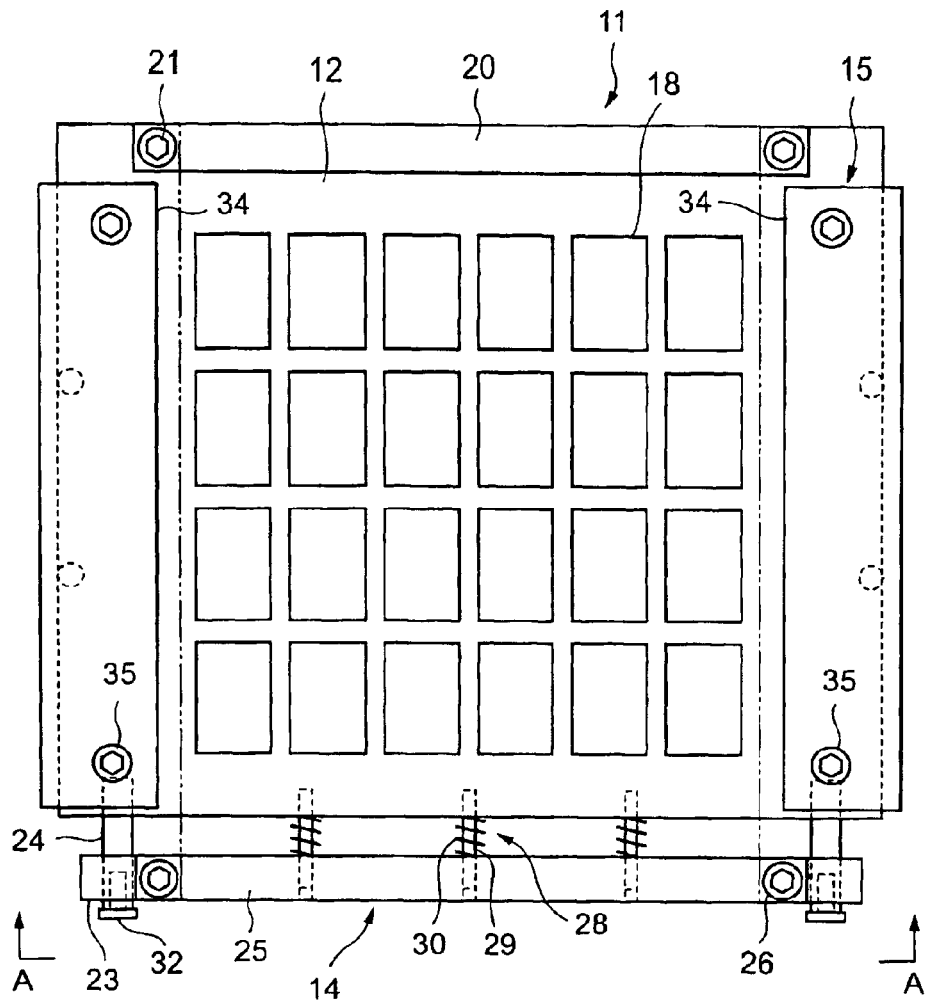
FIG. 2 is a schematic plan view of the gang-patterning mask device shown in FIG. 1 with a second metal mask and a base plate removed.
Figure 3:
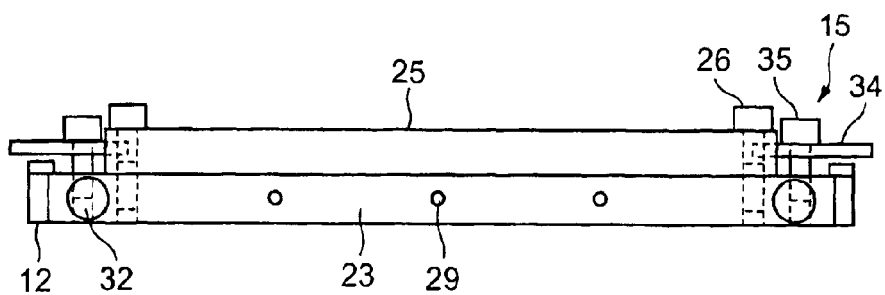
FIG. 3 is a schematic end view of the gang-patterning mask device shown in FIG. 2 taken in the direction of the arrows along line A—A in FIG. 2.
Figure 4:
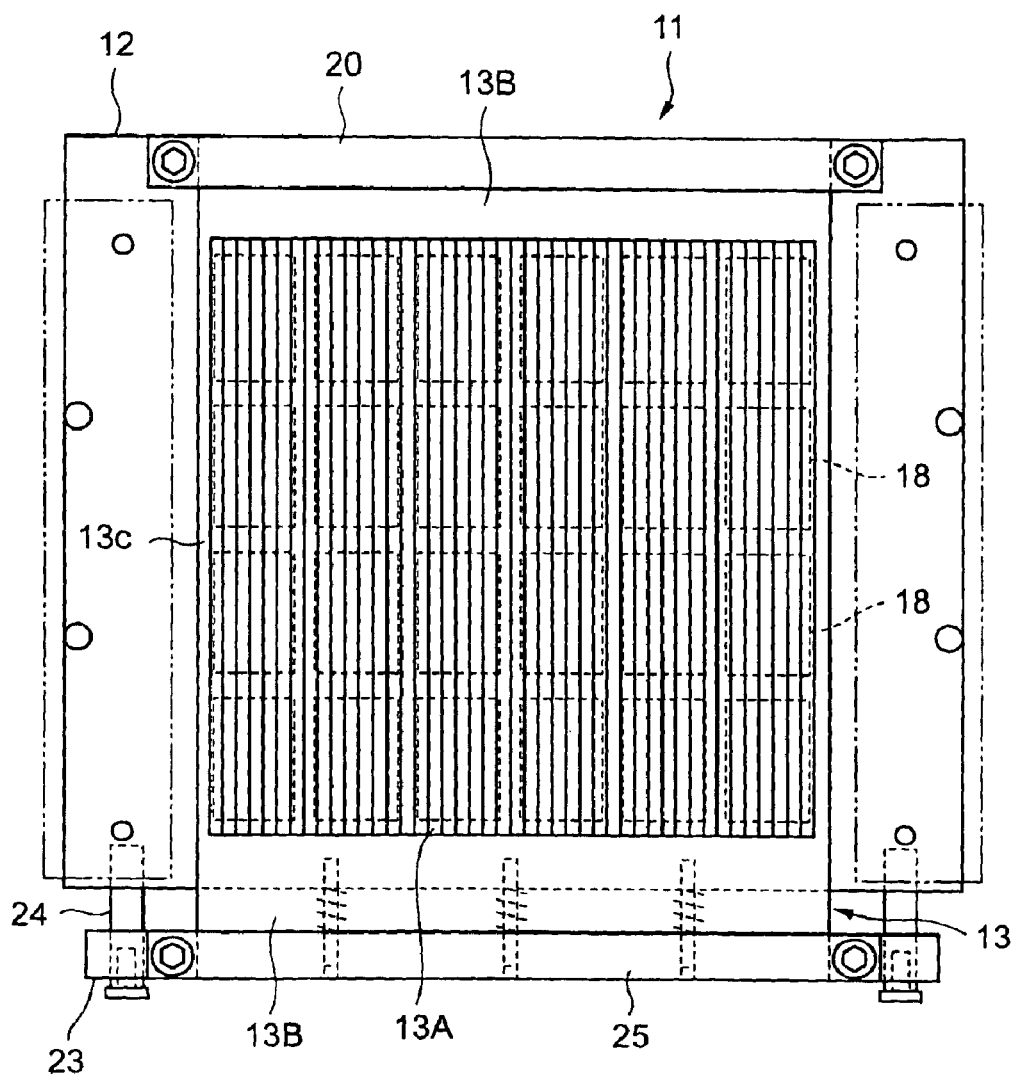
FIG. 4 is a schematic plan view of the gang-patterning mask device shown in FIG. 1 with the second metal mask set in place.

Preferred embodiments of the present invention will be described with reference to the accompanying drawings. FIG. 1(a) is a schematic, exploded, perspective view of a gang-patterning mask device in a first embodiment according to the present invention for vacuum evaporation to be used in fabricating an organic EL device, showing principal component parts, FIG. 1(b) is a schematic, perspective view of the assembled gang-patterning mask device, FIG. 1(c) is a schematic, fragmentary, enlarged sectional view of a screen part of a second metal mask included in the gang-patterning mask device, FIG. 2 is a schematic plan view of the gang-patterning mask device shown in FIG. 1 with the second metal mask and a base plate removed, FIG. 3 is a schematic end view of the gang-patterning mask device shown in FIG. 2 taken in the direction of the arrows along line A—A in FIG. 2, and FIG. 4 is a schematic plan view of the gang-patterning mask device shown in FIG. 1 with the second metal mask set in place. The gang-patterning mask device generally indicated at 11 comprises, as principal component parts, a base plate 12 serving also as a first metal mask, a second metal mask 13, a stretching-and-holding device 14, and a substrate clamping device 15. Those component parts will be individually described.

The base plate 12 has a strength sufficient for supporting the second metal mask 13 in tension and for holding a substrate 17 to be subjected to a vacuum evaporation process thereon. The base plate 12 is provided with a plurality of windows 18, twenty-four windows 18 in this embodiment. The windows 8 define regions to be subjected to vacuum evaporation, respectively. Dimensions of the windows 18 are designed properly according to the size of organic EL devices to be fabricated. For example, the windows 18 are 60 mm in length and 40 mm in width.

The second metal mask 13 is formed by processing a metal sheet of a nickel alloy or a stainless steel having a thickness in the range of about 30 to about 100 $\mu$m. The second metal mask 13 has a screen part 13A formed in a central part thereof and provided with parallel, fine slits 13a arranged at small intervals (FIG. 1(c)), and marginal parts 13B extending in end parts on the opposite sides of the screen part 13A. The slits 13a extends longitudinally, i.e., in a Y-direction indicated by the arrow Y in FIG. 1(a), and the slits 13a are arranged transversely, i.e., in the direction of the arrow X in FIG. 1(a), at predetermined intervals. Dimensions of the screen part 13A are designed such that the screen part 13A covers all the windows 18 of the base plate 12.

The width and pitches of the slits 13a formed in the screen part 13A are determined properly according to the desired number of pixels of an organic EL device to be fabricated. For example, the width w of the slits 13a is 60 $\mu$m, the width (maximum width) d of metal parts 13b defining the slits 13a is 120 $\mu$m. Although the metal parts 13b may be formed in a simple rectangular cross section, the metal parts 13b of this embodiment is formed in a trapezoidal cross section as shown in an enlarged sectional view in FIG. 1(c). Thus, the width of an open end in one of the surfaces of the second metal mask 13, i.e., a lower surface in FIG. 1(c), is greater than that of an open end in the other surface of the second meal mask 13. When a substrate 17 is placed on the second metal mask 13 provided with the slits 13a thus formed and is subjected to a vacuum evaporation process, a vapor flows into the slits 13a through the wider open ends of the slits 13a and a thin film is deposited uniformly on the substrate 17.

Referring to FIG. 1, the second metal screen 13 has support parts 13c extending between the marginal parts 13B on the opposite sides of the screen part 13A. The support parts 13c reinforces the screen part 13A. The rigidity of the screen part 13A having the many metal parts 13b is very low because the metal parts 13b are very fine, and hence the screen part 13A is difficult to handle, is deformed easily and becomes defective. Therefore, the screen part 13A is reinforced by the support parts 13c. Although the greater the width of the support parts 13c, the greater is the reinforcing effect of the support parts 13c is, a very high tension must be applied to the second metal mask 13 to stretch the second metal mask 13 so that the slits 13a are correctly aligned and the second metal mask 13 is difficult to handle if the support parts 13c are excessively wide. In view of such a problem, it is preferable that the width of the support parts 13c is in the range of 2 to 5 mm. Thus, the screen part 13A of the second metal mask 13 is extended in the substantially entire transverse region of the second metal mask 13 excluding the support parts 13c.

The windows 18 of the base plate 12 and the screen part 13A of the second metal mask 13 form effective mask parts 18a. As shown in FIG. 1, the slits 13a of the screen part 13A extend longitudinally, i.e., in the Y-direction, across the plurality of effective mask parts 18a. The windows 18 has a shape corresponding to that of the effective mask part 18a.

Referring to FIGS. 1 to 4, the stretching-and-holding device 14 has a stationary mask clamp 20 and bolts 21 for fastening one of the marginal parts 13B of the second metal mask 13 to the base plate 12, a slider 23 placed on one side of the base plate 12 opposite the other side of the same, with respect to the windows 18 of the base plate 12, corresponding to the side on which the stationary mask clamp 20 is disposed and capable of being moved toward and away from the stationary mask clamp 20, guide rods 24 fixed to the base plate 12 and supporting and guiding the slider 23 for movement, a movable mask clamp 25 and bolts 26 for fastening the other marginal part 13B of the second metal mask 13 to the slider 23, and a moving device 28 for moving the slider 23 away from the stationary mask clamp 20 to apply a desired tension to the second metal mask 13 held by the stationary mask clamp 20 and the movable mask clamp 25.

The moving device 28 includes support rods 29 fixed to the base plate 12, and compression coil springs 30, i.e., elastic means, put on the support rods 29 so as to extend between the base plate 12 and the slider 23. Stoppers 32 are attached to the free ends of the guide rods 24 to prevent the slider 23 from coming of the guide rods 24. The substrate clamping device 15 includes substrate clamps 34 and bolts 35 for pressing the substrate 17 against the base plate 12 to hold the substrate 17 fixedly on the base plate 12.

Operations for subjecting the substrate 17 to a vacuum evaporation process using the gang-patterning mask device 11 will be described. The base plate 12 not mounted with the second metal mask 13 is held by a vise or the like with the compression coil spring 30 compressed and the slider 23 held contiguous with the base plate 12. Then, the second metal mask 13 is placed on the base 12 and is located relative to the windows 18 so that the screen part 13A covers all the windows 18. In this state, one end of the second metal mask 13 is fastened to the base plate 15 by the stationary mask clamp 20, and the other end of the same is fastened to the slider 25 by the movable mask clamp 25. Then, the base plate 12 is removed from the vise to release the slider 23 free. Consequently, the compression coil springs 30 push the slider 23 outward to tension the second metal mask 13 uniformly. Thus, the second metal mask 13 is tensioned and stretched uniformly, the slits 13a of the screen part 13A extend straight at fixed pitches. Since the screen part 13A covers all the windows 18, and the slits 13a are distributed evenly over the windows 18, the metal parts 13b of the screen part 13A can be highly uniformly tensioned by applying a tension to the screen part 13A by the slider 23. Thus, the accuracy of the slits 13a can be secured.

Figure 19:
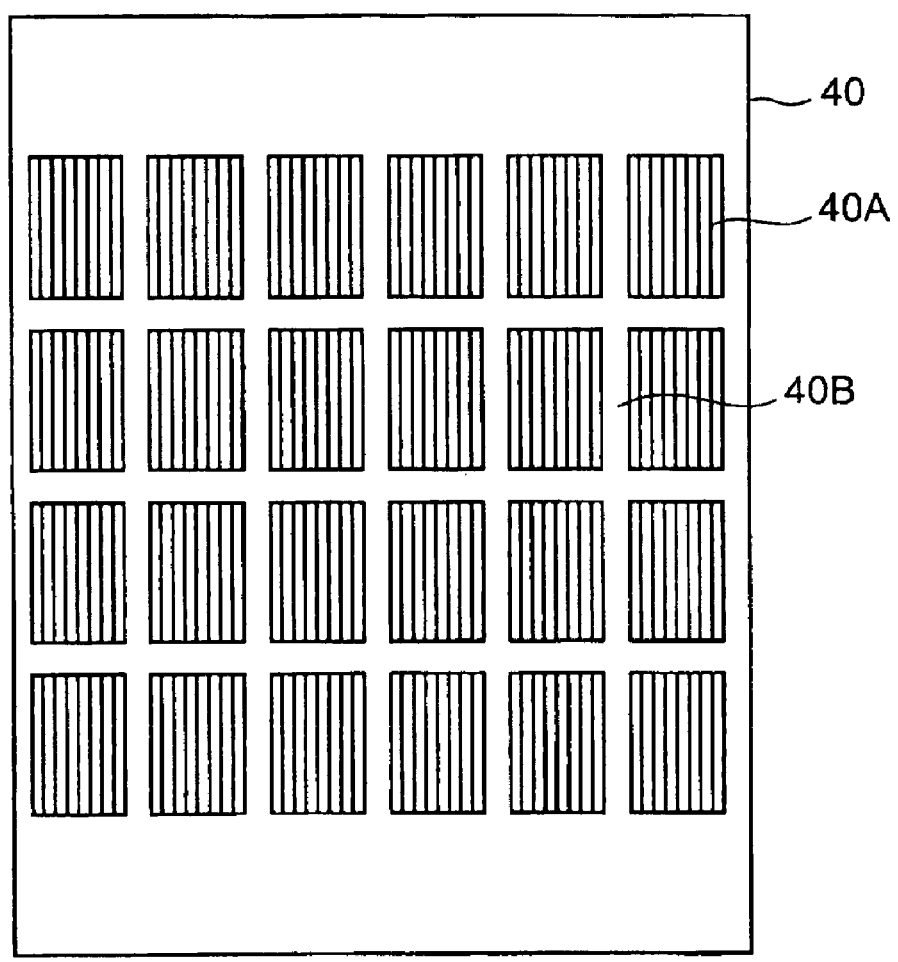
FIG. 19 is a schematic plan view of a metal mask provided with screen parts.

It may be possible that all the windows 18 of the base plate 12 can be covered with screens by using a second metal mask 40 shown in FIG. 19, having screen parts 40A respectively corresponding to the windows 18 of the base plate 12. However, since the second metal mask 40 has both the small screen parts 40A having a low rigidity and partition strips 40B having a high rigidity (FIG. 19), it is difficult to tension all the screen parts 40A uniformly. Consequently, the screen parts 40A are liable to be distorted and it is difficult to secure the accuracy of the slits.

The second metal mask 13 employed in this embodiment is provided with the uniform screen part 13A formed in the wide transverse range. Therefore, the second metal mask 13 is free from those disadvantages and is able to secure the accuracy of the slits easily.

The second metal mask 13 is fastened to the base plate 12 and is tensioned as shown in FIG. 4. Then, as shown in FIG. 1(b), the substrate 17 to be subjected to a vacuum evaporation process is mounted on the second metal mask 13 in alignment with the second metal mask 13, and the substrate 17 is fastened to the base plate 12 and the second metal mask 13 by the substrate clamps 34. Thus, the second metal mask 13 is held contiguous with the surface of the substrate 17 with the slits 13a thereof extended in a predetermined shape, and the base plate 12 provided with the windows 18 is held contiguous with the second metal mask 13. The assembly of the base plate, 12, second metal mask 13 and the substrate 17 is loaded into a vacuum evaporation system, the assembly is held with the windows 18 facing an evaporation source, and then the vacuum evaporation system is operated for vacuum evaporation. Thus, a material is deposited in regions, corresponding to the windows 18, of the surf ace of the substrate 17 in a fine pattern corresponding to that of the slits of the second metal mask 13 in a gang-patterning mode.

Although this embodiment uses the base plate 12 provided with the windows 18 defining regions in which a material is to be deposited as a first meal mask, a first metal mask provided with a plurality of windows defining regions in which a material is to be deposited, and a base plate may be separately made and the first metal mask and the base plate may be fastened together by spot-welding or with screws.

Figure 5:
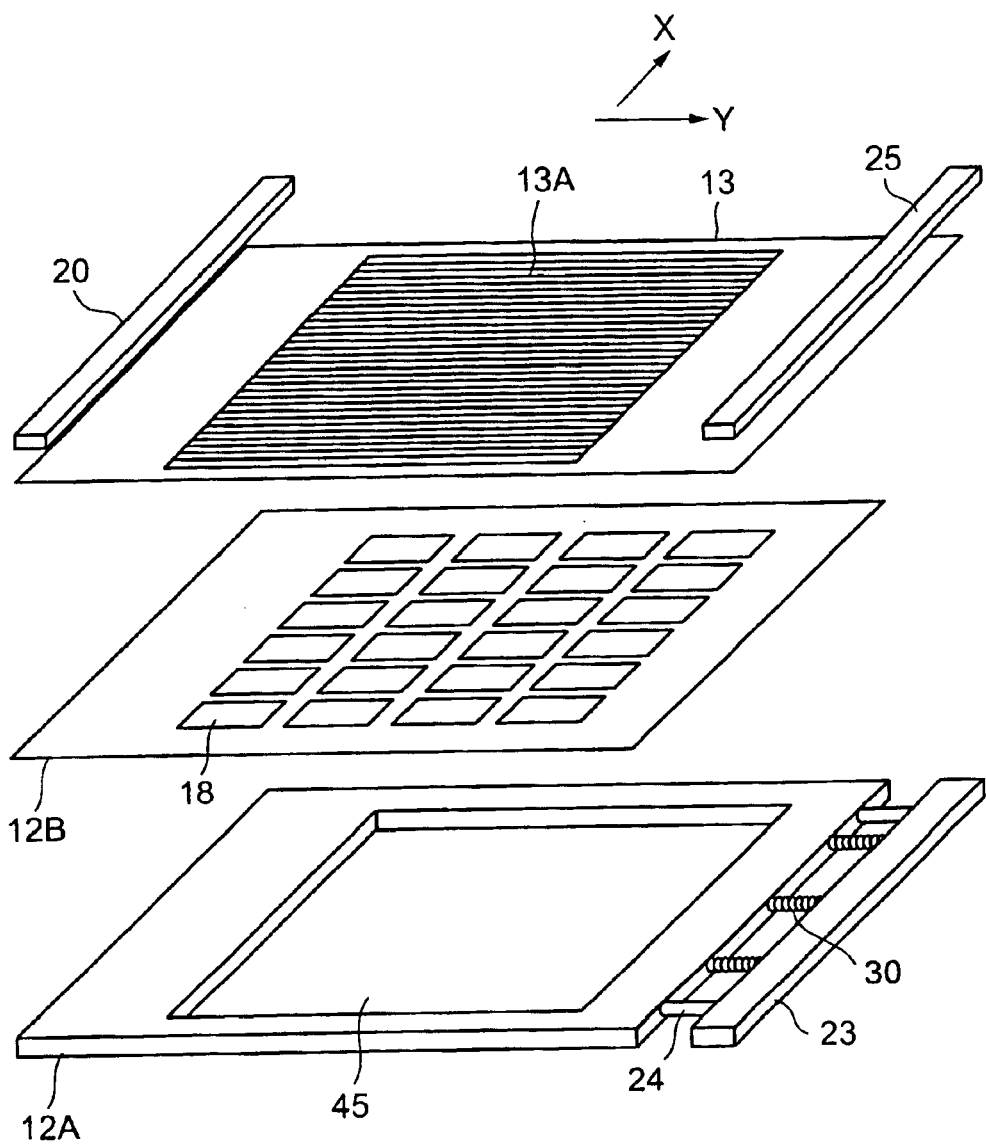
FIG. 5 is a schematic, exploded, perspective view of a gang-patterning mask device in a modification of the first embodiment, showing principal component parts.

FIG. 5 is a schematic, exploded, perspective view of a gang-patterning mask device in a modification of the first embodiment. The gang-patterning mask device shown in FIG. 5 has a base plate 12A and a first metal mask 12B provided with a plurality of windows 18 for defining regions in which a metal is to be deposited. The base plate 12A is provided with a large opening 45 capable of surrounding all the windows 18 of the first meal mask 12B. The first metal mask 12B is placed on and fastened by spot-welding or with screws to the base plate 12A. The first metal mask 12B is formed by processing a metal sheet having a thickness far less than that of the base plate 12A, such as a thickness in the range of about 200 to about 300 μm. The gang-patterning mask device in this modification is the same in other respects as that shown in FIGS. 1 to 4. The first metal mask 12B is formed by forming the windows 18 in a thin meal sheet, which is easier than forming the base plate 12 shown in FIGS. 1 to 4 by forming the windows 18 in a comparatively thick metal plate.

Figure 6:
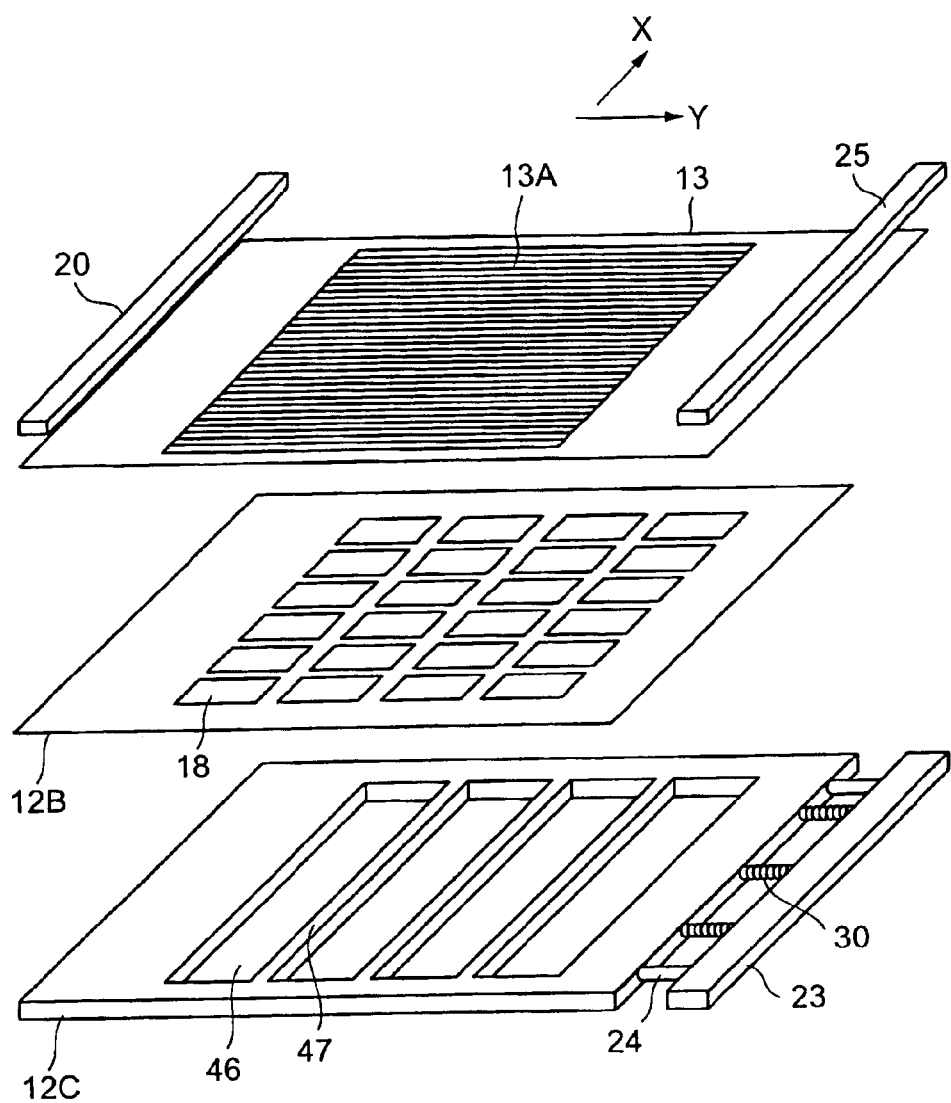
FIG. 6 is a schematic, exploded, perspective view of a gang-patterning mask device in another modification of the first embodiment, showing principal component parts.

Although the base plate 12A of the gang-patterning mask device in the modification shown in FIG. 5 is provided with only the single large window 45 covering all the windows 18, the base plate 12A may be provided with a plurality of small openings. FIG. 6 shows a gang-patterning mask device in another modification of the first embodiment. The gang-patterning mask device shown in FIG. 6 has a base plate 12C provided with four elongate openings 46 spaced by spacing strips 47. The gang-patterning mask device shown in FIG. 6 is the same in other respects as the gang-patterning mask device shown in FIG. 5. The spacing strips 47 of the base plate 12C support a first metal mask 12B, which is effective in suppressing warping of the first metal mask 12B.

Although the longitudinal length, i.e., the length along the Y-direction, of the openings 46 may be equal to that of the windows 18, it is preferable that the longitudinal length of the openings 46 is slightly greater than that of the windows 18.

In each of the foregoing gang-patterning mask devices in the first embodiment, the slider 23 holding one end part of the second metal mask 13 is pushed by the compression coil springs 30 to tension the second metal mask 13 properly. Extension springs or plate springs may be used instead of the compression coil springs 30. Bolts may be used instead of springs for moving the slider 23. Spot-welding may be used for fastening the second metal mask 13 to the base plate 12 (12A, 12C) instead of the mask clamps 20.

As apparent from the foregoing description, the gang-patterning mask device according to the present invention is constructed by superposing the first metal mask provided with the plurality of windows defining regions of a surface of a substrate to be subjected to vacuum evaporation, and the second metal mask having the screen part provided with the plurality of longitudinal, fine slits, and the support parts extending on the opposite sides, respectively, of the screen part. Since the second metal mask can be set taught in place, the second metal mask can be set on the surface of a substrate with the slits extended straight and arranged at the predetermined pitches for a vacuum evaporation process for fabricating an organic EL device in a gang-patterning mode, even if the second metal mask is a very fine mask having very fine slits arranged at very small pitches. Thus, very fine patterns can be formed on a substrate in a gang-patterning mode by vacuum evaporation at a satisfactory productivity.

Second Embodiment

Figure 7:
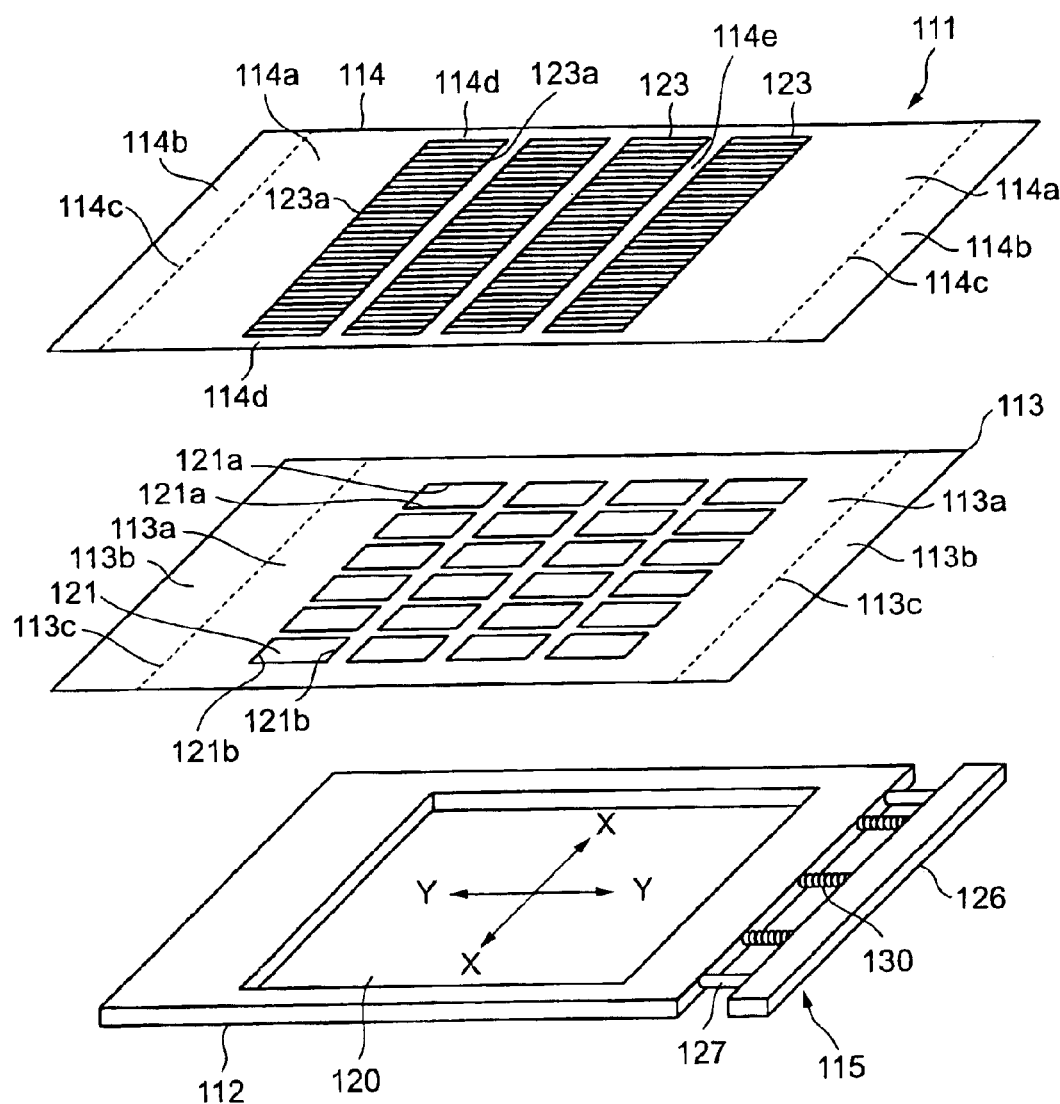
FIG. 7 is a schematic, exploded, perspective view of a gang-patterning mask device in a second embodiment according to the present invention for vacuum evaporation, showing principal component parts.

A gang-patterning mask device in a second embodiment according to the present invention will be described with reference to the accompanying drawings. FIG. 7 is a schematic, exploded, perspective view of the gang-patterning mask device in the second embodiment, showing principal component parts, FIGS. 8(a), 8(b) and 8(c) are schematic perspective views of assistance in explaining a mask assembling procedure for assembling the gang-patterning mask device shown in FIG. 7, FIG. 9 is a schematic bottom view taken from the side of a base plate of the assembled gang-patterning mask device shown in FIG. 7, and FIGS. 10(a), 10(b) and 10(c) are a schematic sectional view taken on line A—A in FIG. 9, a schematic sectional view taken on line B—B in FIG. 9, and a sectional view of a part shown in FIG. 10(b) and showing a slit extending outside a mask part, respectively. The gang-patterning mask device generally indicated at 111 comprises, as principal component parts, a base plate 112, a first metal mask 113, a second metal mask 114, and a stretching-and-holding device 115. Those component parts will be individually described.

The base plate 112 has a strength sufficient for supporting the first metal mask 113 and the second metal mask 114 in tension and for holding a substrate 117 to be subjected to a vacuum evaporation process thereon. The base plate 112 is provided with an opening 120 covering a plurality of effective mask parts 118 formed by the first metal mask 113 and the second metal mask 114.

The first metal mask 113 is formed by processing a metal sheet of the 42 alloy or invar having a thickness in the range of about 50 to about 200 μm. The first metal mask 113 is provided with a plurality of windows 121 of a size substantially the same as the predetermined size of the effective e mask parts 118 (FIG. 9) arranged on longitudinal lines and transverse lines. In this embodiment, the number of the windows 121 is twenty-four. In this specification, longitudinal direction, i.e., direction along the line Y—Y in FIG. 7, is parallel to slits of a screen parts 123 of the second metal mask 114, and transverse direction, i.e., direction parallel to the line X—X in FIG. 7, is perpendicular to the longitudinal direction. Side edges 121a of each window 121 define the side edges of each effective mask part 118. Therefore, the transverse size of the windows 121 is equal to that of the effective mask parts 118. Edges 121b of the windows 121 may correspond to the transverse edges of the effective mask parts 118 or may be beyond the transverse edges of the corresponding effective mask parts 118. Therefore, the longitudinal size of the windows 121 may be equal to or greater than the desired longitudinal size of the effective mask parts 118. In this embodiment, the longitudinal size of the windows 121 slightly greater than the desired longitudinal size of the effective mask parts 118. More concretely, the size of the effective mask parts 118 is determined properly according to the size of organic EL devices to be formed. For example, the effective mask parts 118 have a length, a longitudinal dimension, on the order of 60 mm and a width, i.e., a transverse dimension, on the order of 40 mm. The first metal mask 113 has inner marginal parts 113a extending on the longitudinally opposite sides of a region in which the windows 121 are formed, outer marginal parts 113b extending on the outer sides of the inner marginal parts 113a, and cutting lines 113c each formed between the inner marginal part 113a and the outer marginal part 113b. The outer marginal parts 113b can be easily torn off along the cutting lines. Concretely, the cutting lines are grooves having a V-shaped or U-shaped cross section or perforations.

The second metal mask 114 is formed by processing a metal sheet of a stainless steel or the like having a thickness in the range of 30 to 100 μm. A plurality of parallel, longitudinal, fine slits 123b extending longitudinally, i.e., along the line Y—Y in FIG. 7, are formed at fine transverse intervals, i.e., intervals along the line X—X, in each of rectangular regions extending substantially in all the width, i.e., a transverse dimension, of the second metal mask 114 to form a plurality of screen parts 123. The plurality of screen parts 123 are arranged longitudinally at intervals. In this embodiment, the number of the screen parts 123 is four. Each screen part 123 covers the six windows 121, arranged on a transverse line, of the first metal mask 113. The longitudinal dimension, i.e., a dimension along the line Y—Y, of the screen parts 123 is equal to the longitudinal dimension of the effective mask parts 118. thus, the longitudinally opposite edges 123a of each screen part 123 define the longitudinally opposite edges of each effective mask part 118 (FIG. 9) of a predetermined size. As shown in FIG. 10(b), the edges 123a of each screen part 123 of the second metal mask 114 are on the inner sides of the edges 121b of the windows 121 of the second metal mask 113, i.e., on the side of the middle of the effective mask parts 118. Thus, the edges 123a of the screen parts 123 of the second metal mask 114 determine the longitudinal ranges of the effective mask parts 118 in which a material is to be deposited by vacuum evaporation.

The width and pitches of the slits formed in the screen part 123 are determined properly according to the desired number of pixels of an organic EL device to be fabricated. As shown in an enlarged view in FIG. 10(a) by way of example, the width w of the slits 123b is 60 μm, the width (maximum width) d of metal parts 123c defining the slits 13a is 120 μm. Although the metal parts 123c may be formed in a simple rectangular cross section, the metal parts 123c of this embodiment is formed in a trapezoidal cross section. Thus, the width of an open end in one of the surfaces of the second metal mask 114, i.e., a lower surface in FIG. 10(a), is greater than that of an open end in the other surface of the second meal mask 114. When a substrate 117 is placed on the second metal mask 114 and is subjected to a vacuum evaporation process, a vapor flows into the slits 123b through the wider open ends of the slits 123b and a thin film is deposited uniformly on the substrate 117. The transverse dimension of the windows 121 of the first metal mask 113 superposed on the screen parts 123 is determined such that the longitudinal side edges 121a lie on the flat lower surface of the metal parts 123c of the second metal mask 114. When the second metal mask 114 is superposed on the first metal mask 113, the longitudinal side edges 121a of the windows 121 lie on the flat lower surfaces of the metal parts 123c as shown in FIG. 10(a). Thus, the entire width w of all the slits 123b in the windows 121 can be used effectively for vacuum evaporation.

Referring to FIG. 7, the second metal mask 114 has inner marginal parts 114a extending on the longitudinally opposite sides of a region in which the screen parts 123 are formed, outer marginal parts 114b extending on the outer sides of the inner marginal parts 114a, and cutting lines 114c each formed between the inner marginal part 114a and the outer marginal part 114b. The outer marginal parts 114b can be easily torn off along the cutting lines 114c by bending the outer marginal parts 114b along the cutting lines 114c relative to the inner marginal parts 114a. The second metal screen 114 has support parts 114d extending between the inner marginal parts 114a on the transversely opposite sides of the region in which the screen parts 123 are formed. The support parts 114d reinforces the screen parts 123. The rigidity of the screen parts 123 having the many metal parts 123b is very low because the metal parts 123b are very fine, and hence the screen parts 123 are difficult to handle, is deformed easily and becomes defective. Therefore, the screen parts 123 are reinforced by the support parts 114d. Although the greater the width of the support parts 114d, the greater is the reinforcing effect of the support parts 114d, a very high tension must be applied to the second metal mask 114 to stretch the second metal mask 114 so that the slits are correctly arranged and the second metal mask 114 is difficult to handle if the support parts 114d are excessively wide. In view of such a problem, it is preferable that the width of the support parts 114d is in the range of 2 to 5 mm. When such reinforcement is unnecessary, the support parts 114d may be omitted; that is, the screen parts 123 may be extended in the substantially entire transverse region of the second metal mask 114.

Figure 8:
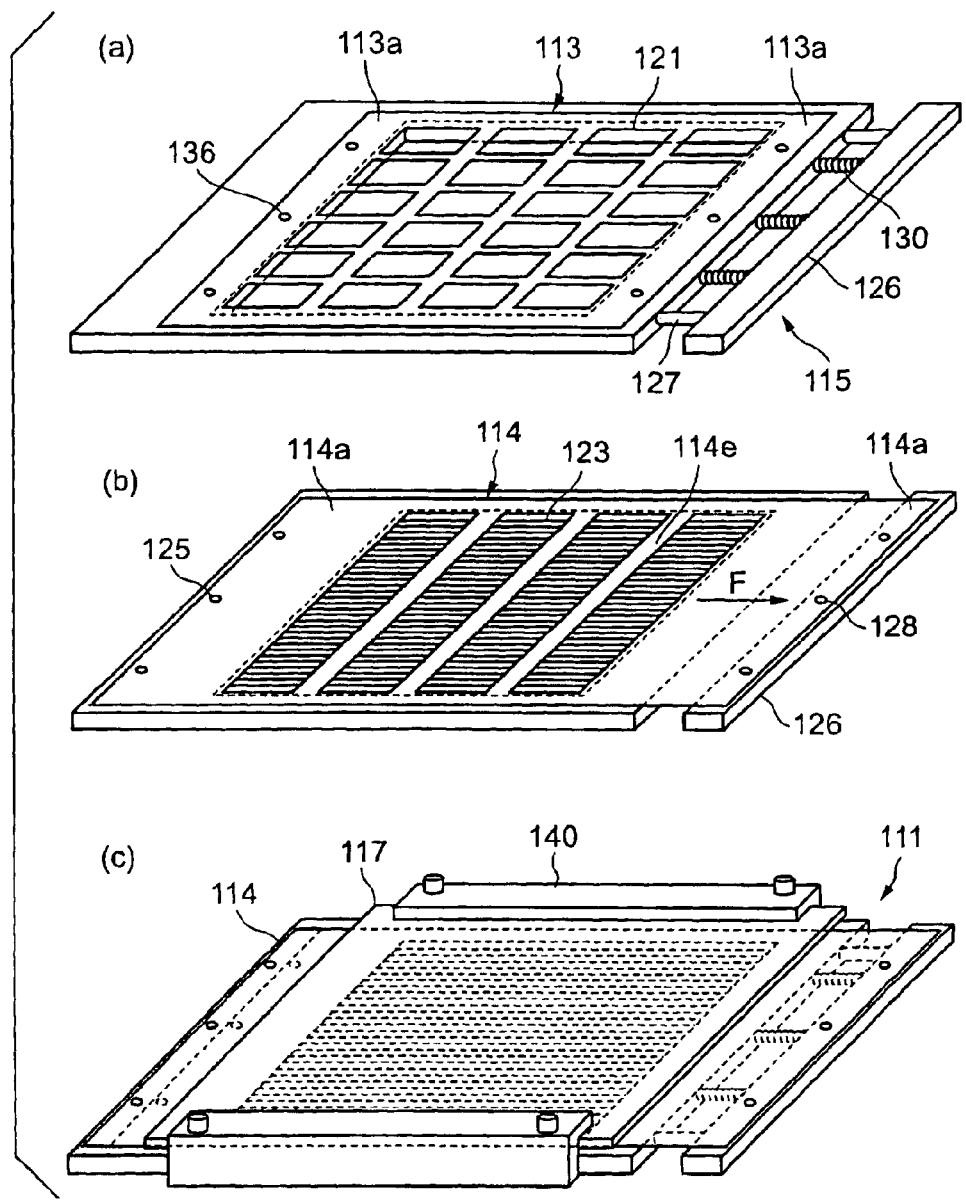
FIGS. 8(a), 8(b) and 8(c) are schematic perspective views of assistance in explaining a mask device assembling procedure for assembling the gang-patterning mask device shown in FIG. 7.
Figure 9:
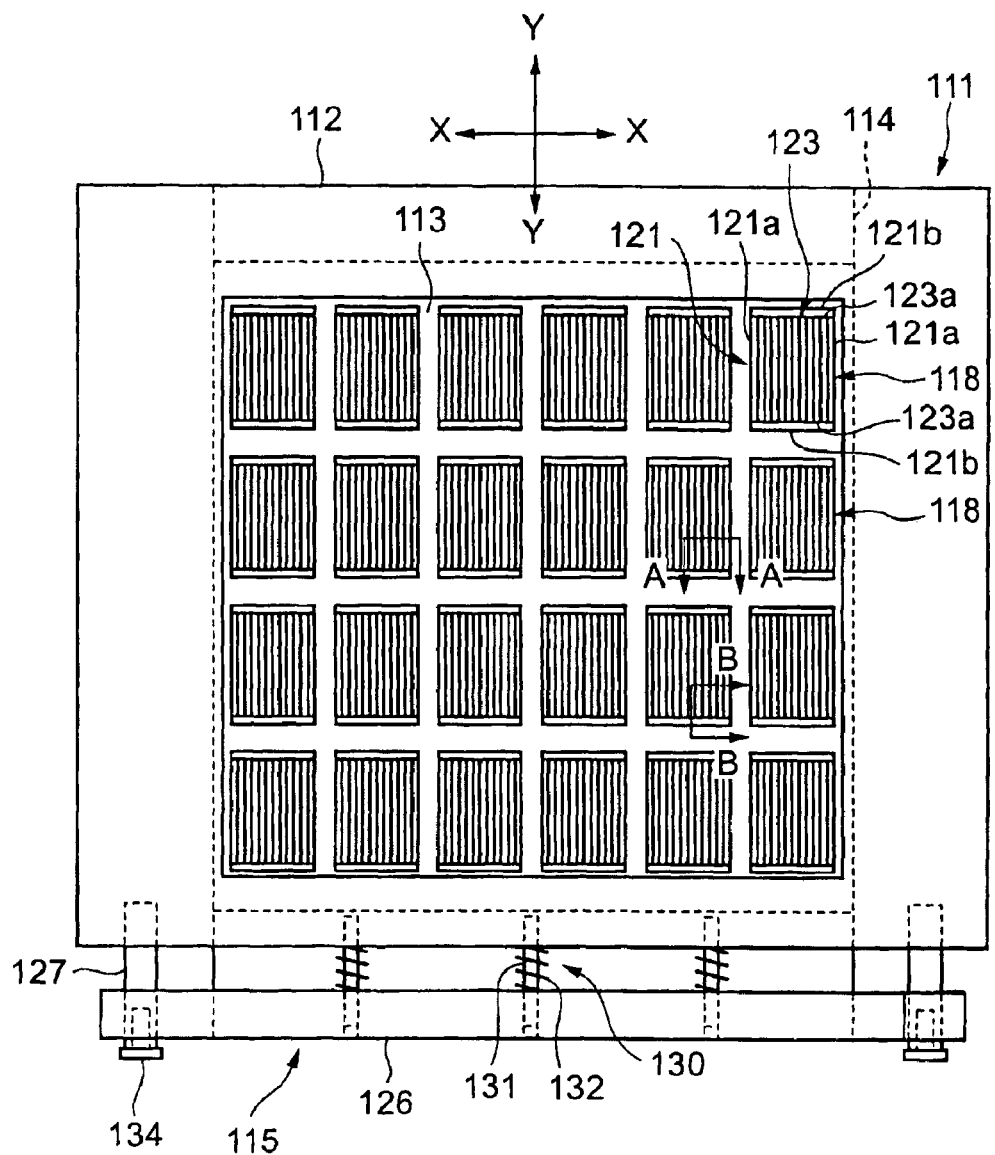
FIG. 9 is a schematic bottom view taken from the side of a base plate of the assembled gang-patterning mask device shown in FIG. 7.
Figure 10:
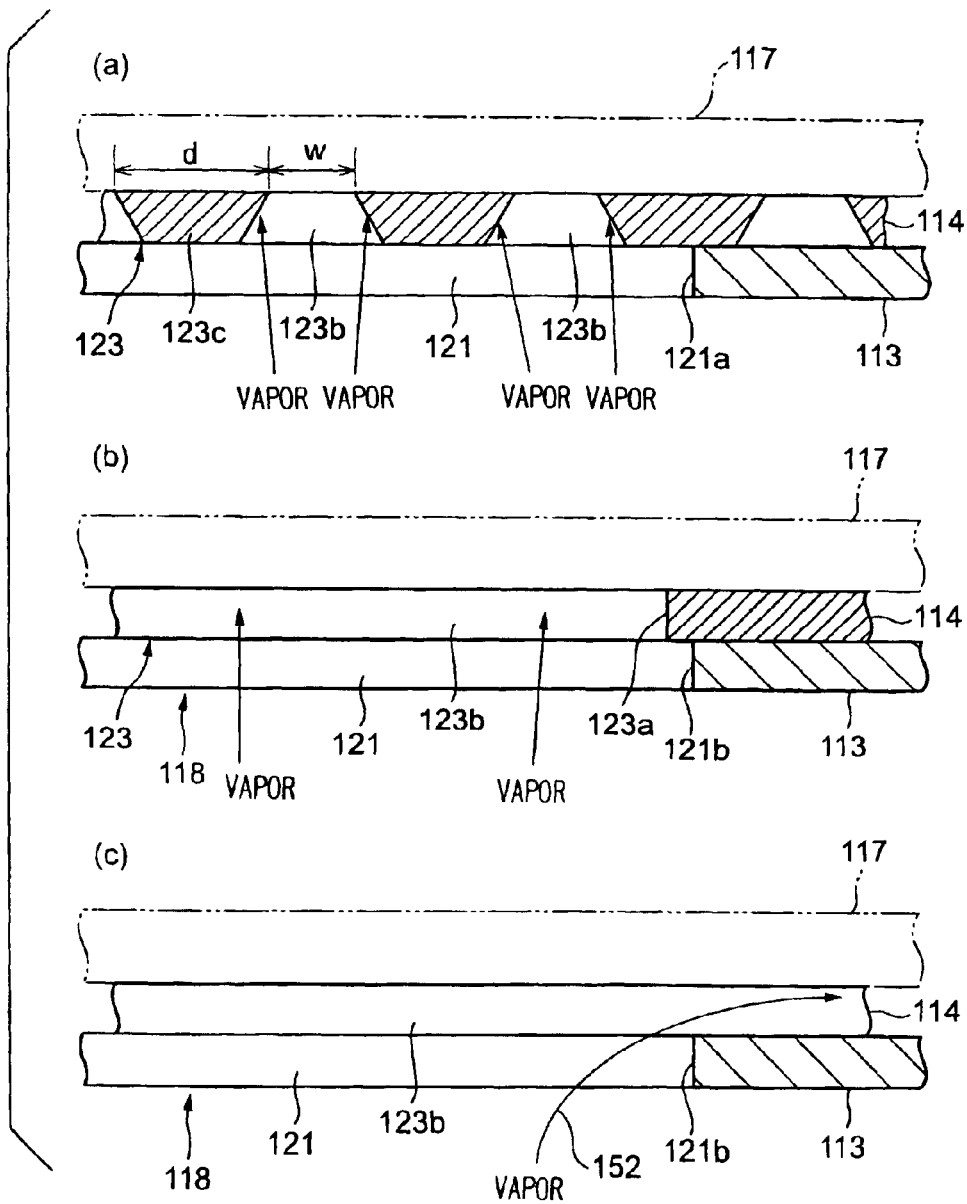
FIGS. 10(a), 10(b) and 10(c) are sectional views taken on line A—A and line B—B, respectively, in FIG. 9.

Referring to FIGS. 7 to 9, the stretching-and-holding device 115 includes stationary fixing means (in this embodiment, spot welds) 125 for fastening one of the inner marginal parts 114a of the second metal mask 114 to the base plate 112, a slider 126 placed on one side of the base plate 112 opposite the other side of the same, with respect to the 120 of the base plate 112, corresponding to the side on which the stationary fixing means 125 are disposed and capable of being moved toward and away from the stationary fixing means 125, guide rods 124 fixed to the base plate 112 and supporting and guiding the slider 126 for movement, movable fixing means (in this embodiment, spot welds) 128 for fastening the other inner marginal part 113a of the second metal mask 114 to the slider 126, and a moving device 130 for moving the slider 126 away from the stationary fixing means 125 to apply a desired tension to the second metal mask 114 held by the stationary fixing means 125 and the movable fixing means 128. The moving device 130 includes support rods 131 fixed to the base plate 112, and compression coil springs 132, i.e., elastic means, put on the support rods 131 so as to extend between the base plate 112 and the slider 126. Stoppers 134 are attached to the free ends of guide rods 127 to prevent the slider 126 from coming of the guide rods 127.

Operations for subjecting the substrate 117 to a vacuum evaporation process using the gang-patterning mask device 111 will be described. The outer marginal parts 113b of the first metal mask 113 are gripped by gripping devices, and the first metal mask 113 is stretched so that the first metal mask is flat and scarcely warped and is placed on a predetermined part of the base plate 112. Then, the inner marginal parts 113a are fastened to the base plate 112 by spot welds 136 (FIG. 8). Then, the outer marginal parts 113b are cut off along the cutting lines 113c and are removed from the first metal mask 113. If the first metal mask 113 is formed by processing a thick metal sheet and does not warp even if any tension is not applied thereto, the first metal mask 113 does not need to be stretched, and the outer marginal parts 113b and the cutting lines 113c may be omitted.

Then, the slider 126 is moved to a position near the base plate 112 against the resilient force of the compression coil springs 132 by a vise or the like and is held at that position before mounting the second metal mask on the base plate 112. Then, the outer marginal parts 114b of the second metal mask 114 are gripped by gripping devices, and the second metal mask 114 is stretched so that the second metal mask 114 is flat and scarcely warped and is placed over the first metal mask 113 held on the base plate 112 and located so that all the windows 121 are covered with the screen parts 123. Then, one of the inner marginal parts 114a is fastened to the base plate 112 by the spot welds 125 (FIG. 8) and the other inner marginal part 114a is fastened to the slider 126 by the spot welds 128. Then, the outer marginal parts 114b are cut off along the cutting lines 114c and are removed from the second metal mask 114. Then, the vise is removed to release the slider 123. Consequently, the slider 126 is moved outward to stretch the second metal mask 114 longitudinally, in the direction of the arrow F as shown in FIG. 8(b) so that the second metal mask 114 may be uniformly tensioned. Thus, the second metal mask 114 is stretched in a uniform tension in the direction parallel to the slits, and the slits of the screen parts 123 are extended straight and are arranged transversely at fixed pitches. Since the screen parts 123 are formed in elongate regions transversely extending over the substantially entire width of the second metal mask 114, and the slits are uniformly distributed in the elongate regions, the metal pats 123c (FIG. 10) of the screen parts 123 can be highly uniformly tensioned by stretching the screen parts 123 by the slider 126, and hence the accuracy of the slits can be secured.

It may be possible that all the windows 121 of the first metal mask 113 can be covered with screens by using the second metal mask 40 shown in FIG. 19, having the screen parts 40A respectively corresponding to the windows 121 of the base plate 12. However, since the second metal mask 40 has both the small screen parts 40A having a low rigidity and partition strips 40B having a high rigidity, it is difficult to tension all the screen parts 40A uniformly. Consequently, the screen parts 40A are liable to be distorted and it is difficult to secure the accuracy of the slits.

The second metal mask 114 employed in this embodiment is provided with the uniform screen parts 123 formed in the wide elongate regions extending over substantially the entire width of the second metal mask 114. Therefore, the second metal mask 114 is free from those disadvantages and is able to secure the accuracy of the slits easily.

The first metal mask 113 and the second metal mask 114 are thus fastened to the base plate 112 to form the effective mask parts 118 (FIG. 9) by superposing the windows 121 of the first metal mask 113 and the screen parts 123 of the second metal mask 114.

Then, as shown in FIG. 8(c), the substrate 117 to be subjected to a vacuum evaporation process is mounted on the second metal mask 114 in alignment with the second metal mask 114, and the substrate 117 is fastened to the base plate 112 by substrate clamps 140. Thus, the plurality of effective mask parts 118 are located on the surface of the substrate 117. The assembly of the base plate, 112, the first metal mask 113, the second metal mask 114 and the substrate 117 is loaded into a vacuum evaporation system, the assembly is held with the base plate 112 facing an evaporation source, and then the vacuum evaporation system is operated for vacuum evaporation. Thus, a material is deposited in regions, corresponding to the windows 121, of the surface of the substrate 117 through the slits 123b of the second metal mask 114 in fine patterns corresponding to those of the slits of the second metal mask 114 in a gang-patterning mode.

In this embodiment, the first metal mask 113 is provided with the windows 121 of dimensions substantially the same as those of the effective mask parts 118. Therefore, the second metal mask 114 does not need necessarily to be provided with the longitudinally arranged plurality of screen parts 123 and partition strips 114e each extending between the adjacent screen parts 123 as shown in FIG. 7, and the second metal mask 114 may be provided with a single common screen part. However, if effective mask parts are formed by covering the plurality of longitudinally arranged windows with the common screen part, the slits 123b extend through the adjacent windows 121. If this combination of the second metal mask provided with the common screen part and the first metal mask 113 provided with the windows 121 is subjected to a vacuum evaporation process, the vapor for vacuum deposition will flow through the windows 121 and leaks into regions outside the edges 121b of the windows 121 of the first metal mask 113 as indicated by the arrow 152 in FIG. 10(c). If the vapor leaks, the boundary of a region in which a material is to be deposited will be blurred. According to the present invention, the screen parts 123 are arranged longitudinally at proper intervals, and the adjacent screen parts 123 are demarcated by the partition strips 114e not provided with any slits. Thus, the present invention is free from the foregoing disadvantage and the vacuum evaporation process can be satisfactorily carried out.

Figure 11:
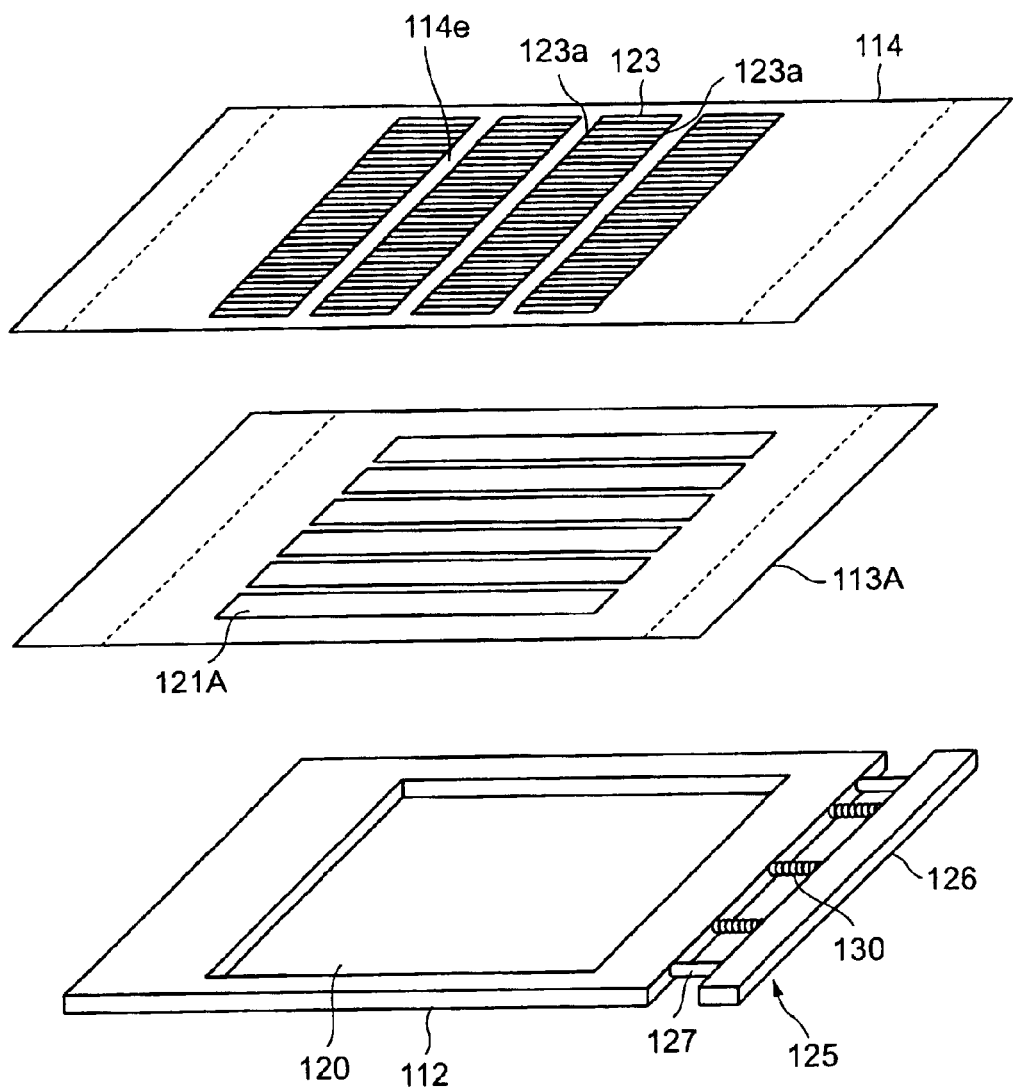
FIG. 11 is a schematic, exploded, perspective view of a gang-patterning mask device in a modification of the second embodiment, showing principal component parts.
Figure 12:
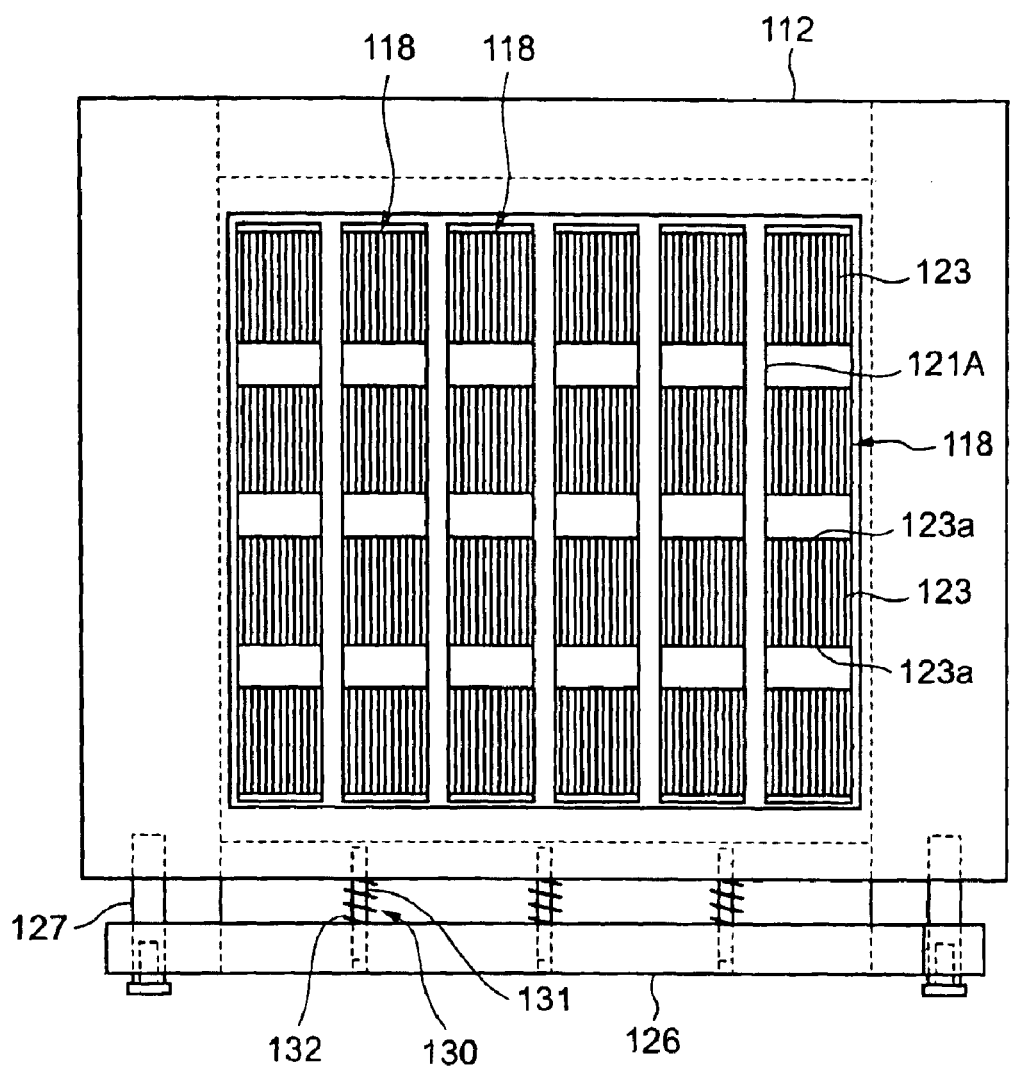
FIG. 12 is a schematic bottom view taken from the side of a base plate of the assembled gang-patterning mask device shown in FIG. 11.

The embodiment shown in FIGS. 7 to 10 has the first metal mask 113 provided with the windows 121 corresponding to the effective mask parts 118. Parts between the longitudinally adjacent windows 121 may be removed to form a longitudinally continuous window. A gang-patterning mask device in a modification of the second embodiment shown in FIGS. 11 and 12 has a first metal mask 113A provided with longitudinally continuous windows 121A. Each window 121A corresponds to each of longitudinal rows of effective mask parts 118. The gang-patterning mask device in the modification is the same in other respects of construction as the embodiment shown in FIGS. 7 to 10. In the modification shown in FIGS. 11 and 12, the first metal mask 113A and a second metal mask 114 are superposed to form the effective mask parts 118 at the intersections of the longitudinally elongate windows 121A and transversely elongate screen parts 123. Thus, very fine patterns can be formed on a substrate in a gang-patterning mode by vacuum evaporation using the gang-patterning mask device in this modification. In this modification, the transverse side edges 123a of the screen parts 123 serve as the transverse side edges of the effective mask parts 118. Therefore, the longitudinal dimension of the screen parts 123 is equal to that of the effective mask parts 118.

In the foregoing embodiment, the second metal mask 114 is tensioned properly by pushing the slider 126 to which one end of the second metal mask 114 is fastened by the compression coil springs 132. Tension springs or plate springs may be used instead of the compression coil springs 132 to tension the second metal mask 114. The slider 126 may be moved by bolts or the like instead of springs.

Figure 13:
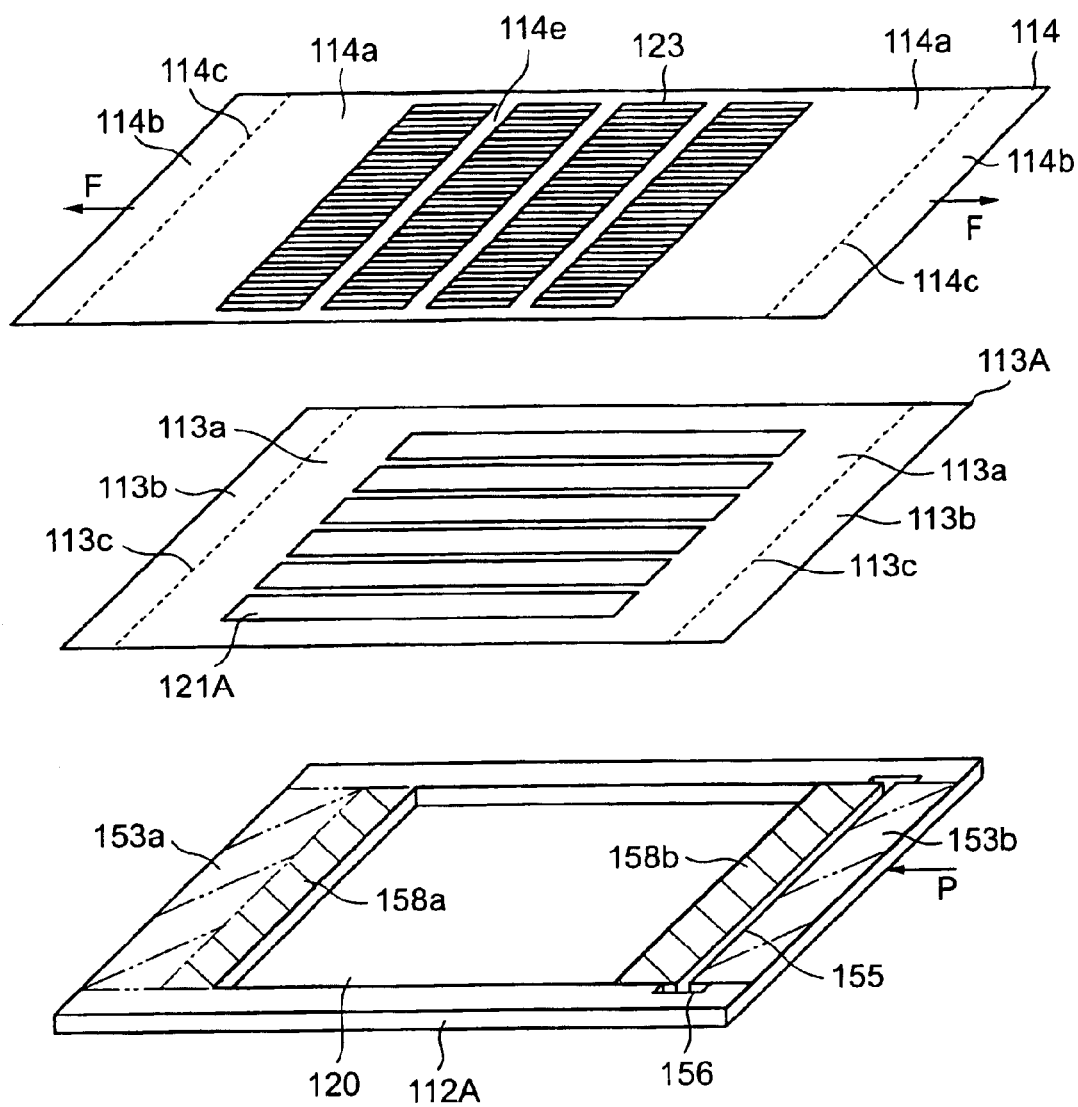
FIG. 13 is a schematic, exploded, perspective view of a gang-patterning mask device in another modification of the second embodiment, showing principal component parts.
Figure 14:
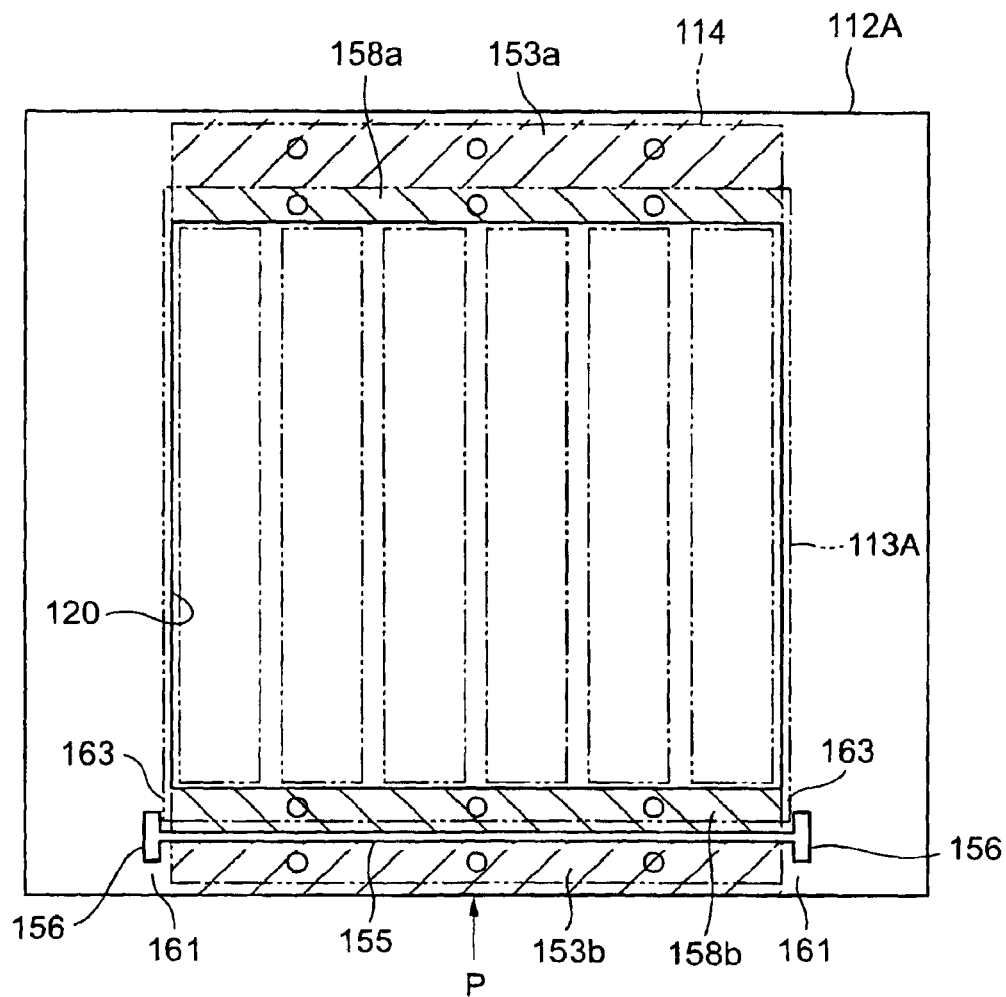
FIG. 14 is a schematic plan view of a base plate included in the gang-patterning mask device shown in FIG. 13.

FIGS. 13 and 14 show a gang-patterning mask device in another modification of the second embodiment. This modification uses a part of a base plate 112A instead of the slider 126 and the compression coil springs 132 as a stretching-and-holding means for holding a second metal mask 114 in a tension. In this modification, the base plate 112A has opposite end parts 153a and 153b. The second metal mask 114 is fastened to the end parts 153a and 153b by, for example, spot-welding. A transverse slit 155 of a transverse dimension equal to or greater than that of the end part 153b is formed in an inner part of the end part 153b, and longitudinal notches 156 are formed at the opposite ends of the slit 155 so as to extend longitudinally on the opposite sides of the slit 155. The end parts 158a and 158b to which the first metal mask 113A is fastened to hold the first mask 113A on the base plate 112A are on the inner sides of the end parts 153a and 153b to which the second metal mask 114 is fastened, and on the inner side of the slit 155. The notches 156 are formed at the opposite ends of the slit 155 to reduce the strength of parts 161 between the notches 156 and the corresponding end parts of the base plate, compared with that of the end part 153b between the slit 155 and the end edge of the base plate, and to reduce the strength of parts 163 between the notches 156 and an opening 120, compared with the strength of the end part 158b. When the end part 153b is warped elastically longitudinally toward the center of the base plate 112A, the parts 161 on the outer side of the notches 156 are strained principally, and the end part 153b is translated without being warped and hence the second metal mask 114 fastened to the end part 153b is not distorted. Similarly, when the first metal mask 113A is fastened to the end parts 158b of the base plate 112A so as to be tensioned, the parts 163 are strained principally when the end part 158b is pulled by the tension of the first metal mask 113A, the end part 158b is translated without being warped and hence the first metal mask 113A is not distorted. If the end part 158b to which the first metal mask 113A is fastened is highly rigid, and is hardly translated by the tension of the first metal mask 113A, the notches 156 do not need to be extended toward the inner side of the slit 155 and may be extended only toward the outer side of the slit 155. This gang-patterning mask device is the same in other respects as that shown in FIGS. 11 and 12.

In assembling this modification, the outer marginal parts 113b of the first metal mask 113A are gripped by gripping devices, and the first metal mask 113A is stretched so that the first metal mask 113A is flat and scarcely warped and is placed on a predetermined part of the base plate 112A. Then, the inner marginal parts 113a are fastened to the end parts 158a and 158b of the base plate 112A by spot-welding. Then, the outer marginal parts 113b are cut off along the cutting lines 113c and are removed from the first metal mask 113A. A load P is applied to the end part 153b of the base plate 112A with a vise or the like to warp the end part 153b inward. Since the end part 153b is separated from the end part 158b to which the first metal mask 113A is fastened by the slit 155, the inner end part 158b is not affected by the elastic warping of the end part 153b, so that the first metal mask 113A fastened to the end part 158b is not warped or distorted. Simultaneously with the elastic warping of the end part 153b, the outer marginal parts 114b of the second metal mask 114 are gripped by gripping devices and the second metal mask 114 is stretched so that a desired tensile force F is applied to the second metal mask 114. The second metal mask 114 thus tensioned is placed on a predetermined part of the base plate 112A, the inner marginal parts 114a are fastened to the end parts 153a and 153b of the base plate 112 by spot-welding. Then, the outer marginal parts 114b are cut off along the cutting lines 114c, and then the vise is removed from the base plate 112A. Thus, the second metal mask 114 is held on the end parts 153a and 153b of the base plate 112A in a tension. The tensile force F applied to the second metal mask 114 in attaching the second metal mask 114 to the base plate 112A is determined such that the slits of the screen parts 123 are extended straight at fixed pitches. The load P applied to the end part 153b of the base plate 112A is equal to the tensile force F applied to the second metal mask 114. Thus, the tensile force F applied to the second metal mask 114 in attaching the second metal mask 114 to the base plate 112a remains in the second metal mask 114 even if the load P applied to the end part 153b is removed after attaching the second metal mask 114 to the base plate 112A. Therefore, the slits of the screen parts 123 of the second metal mask 114 are kept straight and remain at the fixed pitches. Thus, a vacuum evaporation process using the gang-patterning mask device in this modification is able to achieve very fine patterning in a gang-patterning mode. Since the multiple disk device in this modification does not need parts including the slider 126 and the compression coil springs 132, the multiple disk device is simple in construction and can be manufactured at low costs.

As mentioned above, in attaching the second metal mask 114 to the base plate 112A, the desired tensile force F is applied to the second metal mask 114 and, at the same time, the load P equal to the tensile force F is applied to the end part 153b of the base plate 112A. Thus, the second metal mask 114 can be held in an initial state where the tensile force F is applied to the second metal mask 114 even after the second metal mask 114 has been attached to the base plate 112A. However, the tensile force F applied to the second metal mask 114 does not necessarily need to be equal to the load P applied to the end part 153b. If the tensile force F is different from the load P, the tensile force that acts on the second metal mask 114 changes after the second metal mask 114 has been fastened to the base plate 112A and the load P has been removed. Therefore, the initial tensile force F to be applied to the second metal mask 114 and the load P are determined so that a desired tensile force acts on the second metal mask 114 after the load P has been removed.

Although the base plate 112A of the gang-patterning mask device in this modification shown in FIGS. 13 and 14 is provided with the slit 155 and the notches 156, the gang-patterning mask device may use a base plate provided neither a slit nor notches.

Figure 15:
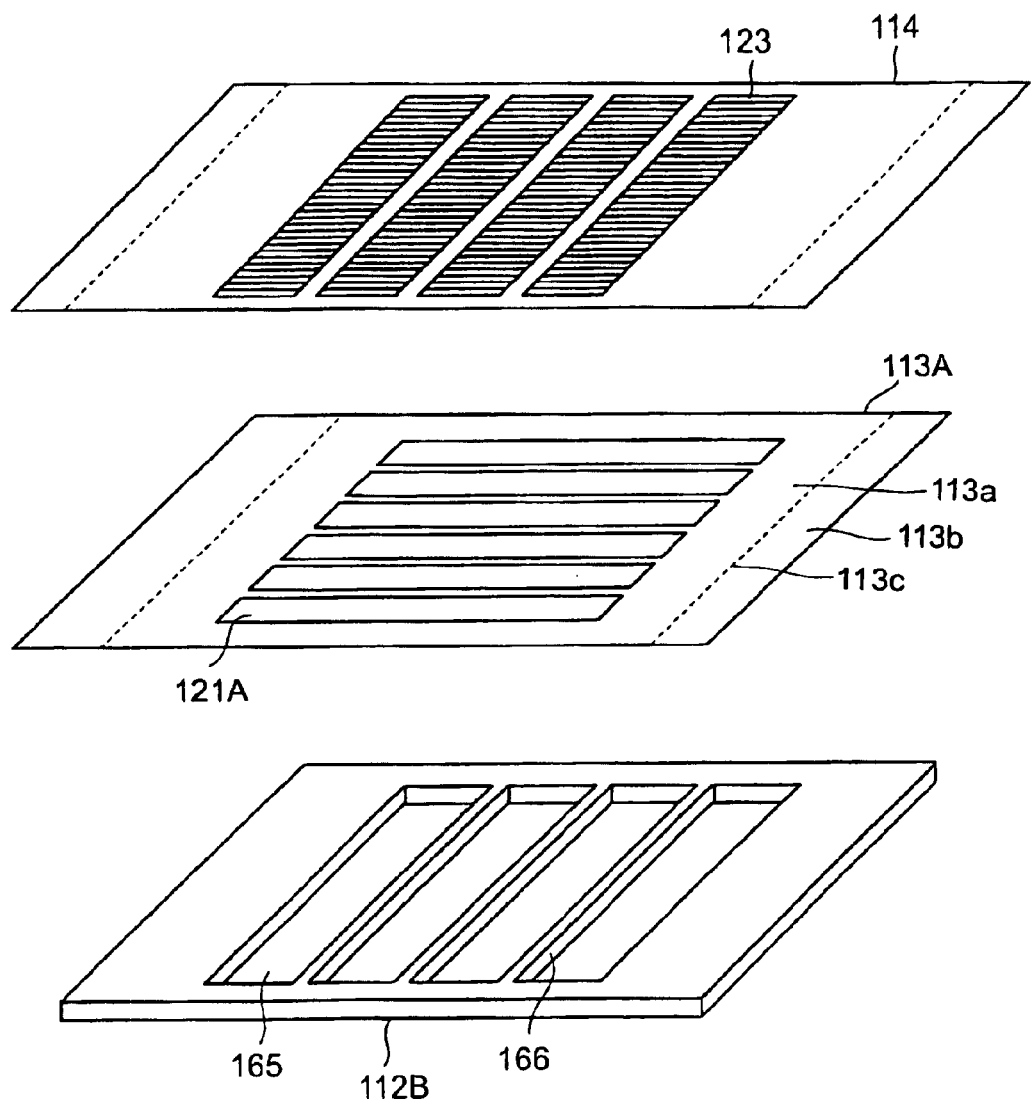
FIG. 15 is a schematic, exploded, perspective view of a gang-patterning mask device in a third modification of the second embodiment, showing principal component parts.

Although the base plates 112 and 112A of the foregoing modifications are provided with the large, single opening 120 capable of including all the effective mask parts 118, the base plates 112 and 112A may be provided with a plurality of openings instead of the single opening 120. FIG. 15 shows a gang-patterning mask device in another modification of the second embodiment. The gang-patterning mask device in the third modification has a base plate 112B provided with four elongate openings 165 separated by partition strips 166. The partition strips 166 of the base plate 112B supports a first metal mask 113A and a second metal mask 114 to suppress the warping of the first metal mask 113 and the second metal mask 114.

The longitudinal dimension, i.e., a dimension along the Y-direction, of the openings 165 may be equal to the longitudinal dimension of the windows 121.

Figure 16:
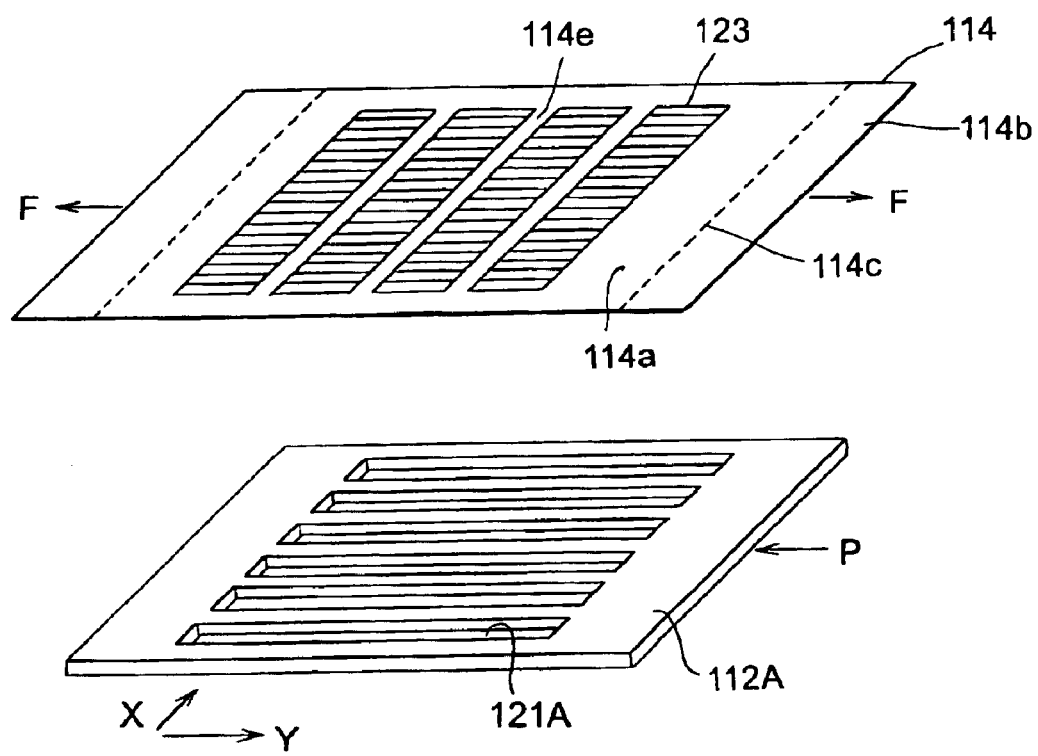
FIG. 16 is a schematic, exploded, perspective view of a gang-patterning mask device in a fourth modification of the second embodiment, showing principal component parts.
Figure 17:
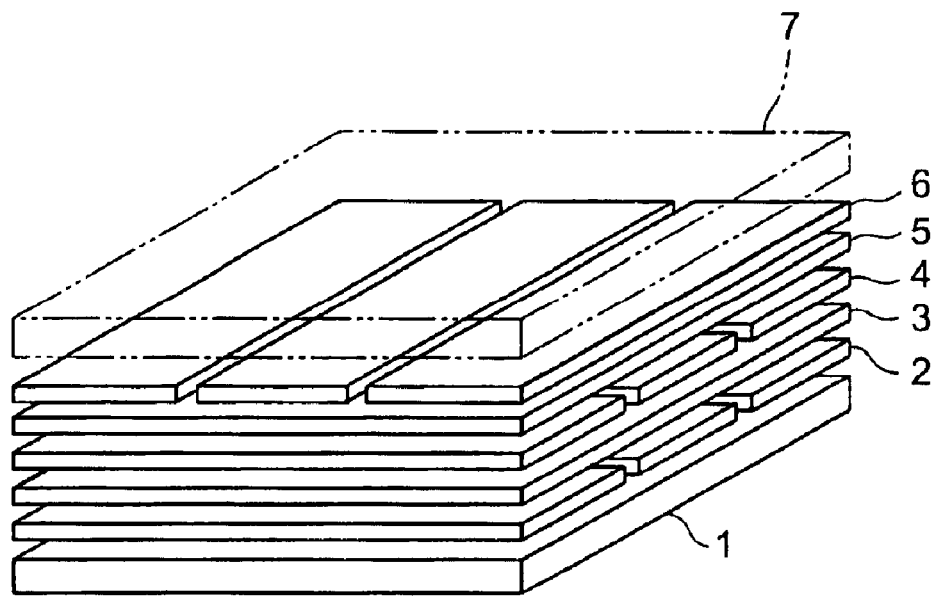
FIG. 17 is a typical perspective view of an organic EL device.
Figure 18:
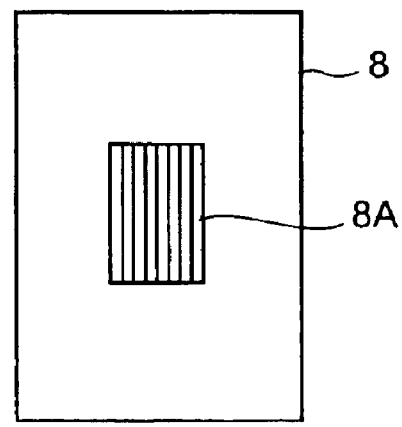
FIG. 18 is a schematic plan view of a metal mask provided with a screen part.

A gang-patterning mask device shown in FIG. 16 has a base plate 112A having the function of a first mask. In FIG. 16, the base plate (the first metal mask) 112A is provided with, for example, six windows 121A. The six windows 121A extend longitudinally, i.e., in the Y-direction. A second metal mask 114 of the same construction as the second metal mask shown in FIG. 13 is placed on the base plate 112A provided with the six windows 121A.

Since the base plate 112A shown in FIG. 16 serves also as the first meal mask, the gang-patterning mask device shown in FIG. 16 does not need any mask corresponding to the first metal mask in addition to the base plate 112A.

As apparent from the foregoing description, the gang-patterning mask device of the present invention has the plurality of effective mask parts by superposing the first metal mask provided with the windows, and the second metal mask provided with the screen part or the plurality of screen parts on the base plate. The screen part extends over the substantially entire width of the second metal mask and is provided with the longitudinal slits. The plurality of screen parts are arranged longitudinally at intervals. Tensile force is applied to the second metal mask in a direction parallel to the slits of the screen part or the screen parts to align the slits. Thus, the slits are extended straight at the predetermined pitches even if the screen part is provided with very fine, parallel slits arranged at very small pitches. Therefore, highly fine patterns can be formed in a gang-patterning mode at a high productivity by a vacuum evaporation process using the gang-patterning mask device. Since the slits do not extend across the longitudinally adjacent effective mask parts, the vapor for vacuum deposition does not leak outside the desired pattern regions, in which patterns are to be formed, on the surface of the substrate and hence the desired pattern regions can be clearly demarcated. Thus, an organic EL device fabricating process using the gang-patterning mask device is able to form passive low-molecular organic layers, active low-molecular organic layers and passive cathodes in fine patterns at a high productivity.

What is claimed is:

1. A gang-patterning mask device for vacuum evaporation having a plurality of affective mask parts arranged on longitudinal and transverse rows, said gang-patterning mask device comprising:

a first mask provided with a plurality of windows; and a second mask placed on the first mask and having a screen part provided with a plurality of fine slits extending a longitudinal direction;

wherein the screen part of the second mask is formed in an entire region in a transverse direction covering at least all the windows, and the screen part and the windows define the effective mask parts.

2. The gang-patterning mask device for vacuum evaporation according to claim 1, wherein
the second mask has a pair of support parts on the transversely opposite sides, respectively, of the screen part.

3. The gang-patterning mask device for vacuum evaporation according to claim 1, wherein
the windows of the first mask is formed in a shape corresponding to that of the effective mask parts, and the screen part of the second mask extends in a longitudinal direction across the plurality of windows.

4. The gang-patterning mask device for vacuum evaporation according to claim 3, wherein
the first mask functions as a base plate, and a stretching-and-holding means for longitudinally stretching and holding the second mask is provided on the base plate.

5. The gang-patterning mask device for vacuum evaporation according to claim 4, wherein
the stretching-and-holding moans includes a slider capable of holding an end part of the second mask and of moving relative to the base plate, and
a moving means for moving the slider relative away from the base plate.

6. The gang-patterning mask device for vacuum evaporation according to claim 5, wherein
the moving means is an elastic means capable of exerting resilient force.

7. The gang-patterning mask device for vacuum evaporation according to claim 3, wherein
the first mask is placed on a base plate provided with an opening, and a stretching-and-holding means for longitudinally stretching and holding the second mask is provided on into the base plate.

8. The gang-patterning mask device for vacuum evaporation according to claim 7, wherein
the opening of the base plate extends over all the windows of the first mask.

9. The gang-patterning mask device for vacuum evaporation according to claim 7, wherein
the base plate is provided with a plurality of openings extending in a transverse direction, and the openings have a longitudinal length corresponding to that of the windows of the first mask.

10. The gang-patterning mask device for vacuum evaporation according to claim 1, wherein
the second mask is provided with a plurality of screen parts, and the plurality of screen parts are arranged longitudinally at predetermined intervals.

11. The gang-patterning mask device for vacuum evaporation according to claim 10, wherein
the screen parts of the second mask have a longitudinal length corresponding to that of the effective mask parts.

12. The gang-patterning mask device for vacuum evaporation according to claim 10, wherein
the windows of the first mask are formed in a shape corresponding to that of the effective mask parts.

13. The gang-patterning mask device for vacuum evaporation according to claim 10, wherein
each of the windows of the first mask extends longitudinally across the plurality of effective mask parts.

14. The gang-patterning mask device for vacuum evaporation according to claim 10, wherein
the first mask functions as a base plate, and a stretching-and-holding means for longitudinally stretching and holding the second mask is provided on the base plate.

15. The gang-patterning mask device for vacuum evaporation according to claim 14, wherein
the stretching-and-holding means includes a slider capable of holding an end part of the second mask and of moving relative to the base plate, and a moving means for moving the slider away from the base plate.

16. The gang-patterning mask device for vacuum evaporation according to claim 15, wherein
the moving means is an elastic means capable of exerting resilient force.

17. The gang-patterning mask device for vacuum evaporation according to claim 10, wherein
the first mask is placed on a base plate provided with an opening, and a stretching-and-holding means for longitudinally stretching and holding the second mask is provided on the base plate.

18. The gang-patterning mask device for vacuum evaporation according to claim 17, wherein
the opening of the base plate extends over all the windows of the first mask.

19. The gang-patterning mask device for vacuum evaporation according to claim 17, wherein
the base plate is provided with a plurality of openings extending in a transverse direction, and each opening has a longitudinal length corresponding to that of the windows of the first mask.

20. The gang-patterning mask device for vacuum evaporation according to claim 17, wherein
the base plate has marginal parts at longitudinally opposite ends to which the second mask is fixed in its a transverse slit is formed on the inner side of one of marginal parts, and the marginal part adjacent to the slit is distorted inward beforehand to hold the second mask in a longitudinally stretched state.

21. The gang-patterning mask device for vacuum evaporation according to claim 20, wherein
longitudinal notches are formed at the opposite ends of the slit, respectively.

* * * * *